United States Patent
Tan et al.

(10) Patent No.: US 10,727,187 B2
(45) Date of Patent: Jul. 28, 2020

(54) SOLID OXIDE BATTERY

(71) Applicant: Massachusetts Institute of Technology, Cambridge, MA (US)

(72) Inventors: Aik Jun Tan, Cambridge, MA (US); Geoffrey S. D. Beach, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 43 days.

(21) Appl. No.: 16/012,155

(22) Filed: Jun. 19, 2018

(65) Prior Publication Data

US 2018/0366420 A1    Dec. 20, 2018

Related U.S. Application Data

(60) Provisional application No. 62/521,653, filed on Jun. 19, 2017.

(51) Int. Cl.
*H01L 21/00* (2006.01)
*H01L 23/58* (2006.01)
(Continued)

(52) U.S. Cl.
CPC .............. *H01L 23/58* (2013.01); *C25B 1/10* (2013.01); *C25B 9/10* (2013.01); *C25B 13/04* (2013.01);
(Continued)

(58) Field of Classification Search
CPC .............. H01L 23/58; C25B 9/10; C25B 1/10
See application file for complete search history.

(56) References Cited

U.S. PATENT DOCUMENTS 5,290,323 A * 3/1994 Okuyama ........... H01M 8/1233
                                                    29/623.5
6,428,920 B1 * 8/2002 Badding .............. C04B 35/016
                                                    428/699
(Continued)

FOREIGN PATENT DOCUMENTS

WO    WO-2018236834 A1 * 12/2018 ............. C25B 13/04

OTHER PUBLICATIONS

Aruna et al., Stability and hydrogenation of "bare" gadolinium nanoparticles. Adv. Funct. Mater. 15, 131-137 (2005).
(Continued)

*Primary Examiner* — Laura M Menz
(74) *Attorney, Agent, or Firm* — Smith Baluch LLP

(57) ABSTRACT

A solid oxide battery includes a solid electrolyte disposed between a first electrode and a second electrode. The first electrode and the second electrode are coupled to an external source or load to charge or discharge the solid oxide battery. The solid electrolyte is formed from a proton conducting material to transport and store hydrogen, which is the source of chemical energy. The second electrode is formed from a noble metal configured to induce formation of oxygen vacancies at the interface between the second electrode and the solid electrolyte. The oxygen vacancies are used to split water molecules during charging of the solid oxide battery, which results in the generation of hydrogen. Under bias, the hydrogen ions are transported into the solid electrolyte and stored. During discharge, a reverse process occurs where hydrogen is used to generate water and electricity.

14 Claims, 20 Drawing Sheets

(51) Int. Cl.
  H01M 8/1246 (2016.01)
  H01L 23/538 (2006.01)
  H01M 8/18 (2006.01)
  C25B 13/04 (2006.01)
  C25B 1/10 (2006.01)
  C25B 9/10 (2006.01)
  H01M 8/1286 (2016.01)
  H01M 8/124 (2016.01)

(52) U.S. Cl.
  CPC ...... *H01L 23/5387* (2013.01); *H01M 8/1246* (2013.01); *H01M 8/184* (2013.01); *H01M 8/1286* (2013.01); *H01M 2008/1293* (2013.01); *H01M 2300/0071* (2013.01)

(56) References Cited

U.S. PATENT DOCUMENTS

| | | | | |
|---|---|---|---|---|
| 7,344,801 | B2* | 3/2008 | Cheng | H01M 8/0293 429/101 |
| 8,758,949 | B2* | 6/2014 | Pal | C01B 3/50 204/250 |
| 2004/0121227 | A1* | 6/2004 | Cheng | H01M 8/0293 429/101 |
| 2008/0044706 | A1 | 2/2008 | Iijima | |
| 2008/0085439 | A1* | 4/2008 | Hilliard | H01M 8/1286 429/495 |
| 2009/0071841 | A1* | 3/2009 | Pal | C01B 3/50 205/638 |
| 2011/0117434 | A1* | 5/2011 | Ogasawara | H01M 4/131 429/223 |
| 2012/0171596 | A1* | 7/2012 | Hilliard | C25B 9/10 429/482 |
| 2013/0026032 | A1* | 1/2013 | Pal | C01B 3/50 204/250 |
| 2014/0050970 | A1* | 2/2014 | Li | H01M 4/26 429/163 |
| 2014/0147747 | A1 | 5/2014 | King et al. | |
| 2015/0030909 | A1 | 1/2015 | Ihlefeld et al. | |
| 2016/0379764 | A1 | 12/2016 | Tour et al. | |
| 2018/0205112 | A1* | 7/2018 | Thomas-Alyea | H01M 10/056 |
| 2018/0364544 | A1* | 12/2018 | Beach | G02F 1/0316 |
| 2018/0366420 | A1* | 12/2018 | Tan | H01L 23/58 |

OTHER PUBLICATIONS

Bates et al., Thin-film rechargeable lithium batteries. J. Power Sources. 54, 58-62 (1995).
Bauer et al., Magneto-ionic control of interfacial magnetism. Nat. Mater. 14, 174-81 (2015).
Campbell et al., Catalyst-support interactions: Electronic perturbations. Nat. Chem. 4, 597-598 (2012).
Chen et al., Electronic paper: Flexible active-matrix electronic ink display. Nature. 423, 136 (2003). 1 page.
Crawford et al., Impact of Different Electrolytes on Photocatalytic Water Splitting. J. Electrochem. Soc. 156, H346 (2009).6 pages.
Dudney, Solid-state thin-film rechargeable batteries. Mater. Sci. Eng. B. 116, 245-249 (2005).
Ellis et al., Three-dimensional self-supported metal oxides for advanced energy storage. Adv. Mater. 26, 3368-3397 (2014).
Fabbri et al., Developments and perspectives of oxide-based catalysts for the oxygen evolution reaction. Catal. Sci. Technol. 4, 3800-3821 (2014).
Goodenough et al., The Li-ion rechargeable battery: A perspective. J. Am. Chem. Soc. 135, 1167-1176 (2013).
International Search Report and Written Opinion in PCT/US2018/038235 dated Oct. 22, 2018. 16 pages.
Kaufman et al., When Do Batteries End and Supercapacitors Begin? Science. 343, 1210-1211 (2014).
Kim et al., Oxygen vacancies enhance pseudocapacitive charge storage properties of $MoO_{3-x}$. Nat. Mater. 1 (2016). 9 pages.
Lai et al., Ultrahigh-energy-density microbatteries enabled by new electrode architecture and micropackaging design. Adv. Mater. 22, 139-144 (2010).
Landman et al., Photoelectrochemical water splitting in separate oxygen and hydrogen cells. Nat. Mater., 1-7 (2017).
Lee et al., Electrochromic coloration efficiency of $a-WO_{3-y}$ thin films as a function of oxygen deficiency. Appl. Phys. Lett. 75, 1541 (1999).
Liu et al., Graphene-based supercapacitor with an ultrahigh energy density. Nano Lett. 10, 4863-4868 (2010).
Manchon et al., X-ray analysis of the magnetic influence of oxygen in Pt/Co/x trilayers. J.Appl. Phys. 103, 07A912 (2008). 4 pages.
Minh, Ceramic Fuel Cells. J. Am. Ceram. Soc. 76, 563-588 (1993).
Niklasson et al., Electrochromics for smart windows: thin films of tungsten oxide and nickel oxide, and devices based on these. J. Mater. Chem. 17, 127-156 (2007).
Pikul et al., High-power lithium ion microbatteries from interdigitated three-dimensional bicontinuous nanoporous electrodes. Nat. Commun. 4, 1732 (2013). 5 pages.
Rahman et al., High Energy Density Metal-Air Batteries: A Review. J. Electrochem. Soc. 160, A1759-A1771 (2013). 13 pages.
Rodriguez et al., Water gas shift reaction on Cu and Au nanoparticles supported on $CeO_2(111)$ and $ZnO(0001)$: Intrinsic activity and importance of support interactions. Angew. Chemie-Int. Ed. 46, 1329-1332 (2007).
Simon et al., Materials for electrochemical capacitors. Nat. Mater. 7, 845-854 (2008).
Stamenkovic et al., Energy and Fuels from Electrochemical Interfaces. Nat. Mater. 16, 57-69 (2017).
Sun et al., 3D printing of interdigitated Li-ion microbattery architectures. Adv. Mater. 25, 4539-4543 (2013).
Tymoczko et al., Making the hydrogen evolution reaction in polymer electrolyte membrane electrolysers even faster. Nat. Commun. 7, 10990 (2016). 6 pages.
Valov et al., Nanobatteries in redox-based resistive switches require extension of memristor theory. Nat. Commun. 4, 1771 (2013). 9 pages.
Wang et al., Lithium and lithium ion batteries for applications in microelectronic devices: A review. J. Power Sources. 286, 330-345 (2015).
Zhou et al., Progress in flexible lithium batteries and future prospects. Energy Environ. Sci. 7, 1307-1338 (2014).
Zhu et al., Carbon-Based Supercapacitors Produced by Activation of Graphene. Science. 332, 1537-1542 (2011).

* cited by examiner

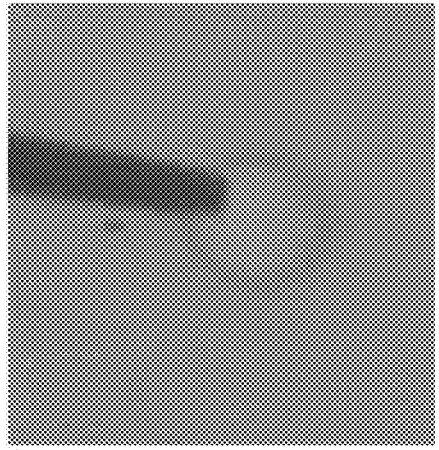
FIG. 10C
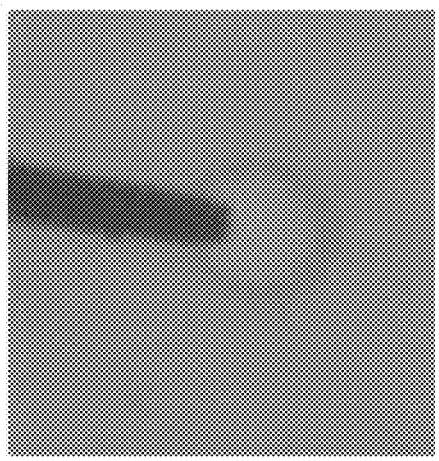
FIG. 10B
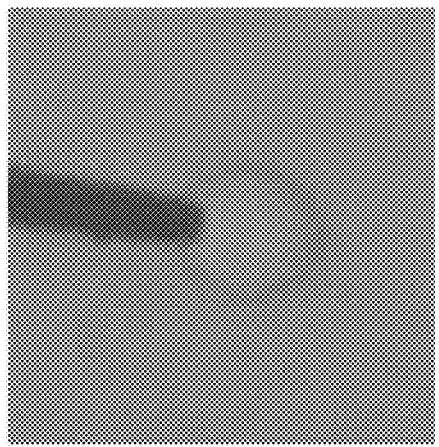
FIG. 10A
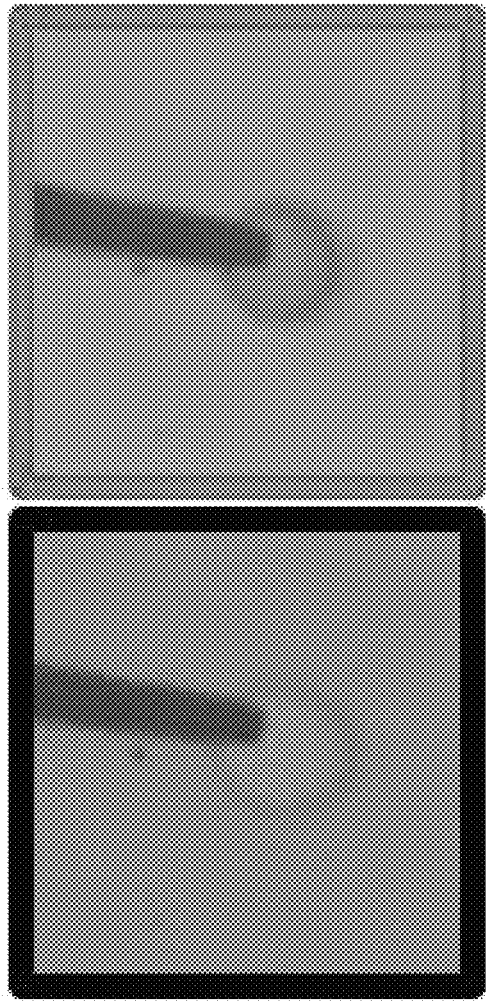
FIG. 10E
FIG. 10D

SOLID OXIDE BATTERY

CROSS-REFERENCE TO RELATED PATENT APPLICATION(S)

This application claims priority, under 35 U.S.C. § 119(e), to U.S. Application No. 62/521,653, which was filed on Jun. 19, 2017, and is incorporated herein by reference in its entirety.

GOVERNMENT SUPPORT

The invention was made with Government support under Grant No. DMR-1419807 awarded by the National Science Foundation. The Government has certain rights in the invention.

BACKGROUND

A thin film, solid-state battery is typically comprised of a multilayer structure that includes solid electrodes and a solid electrolyte. By utilizing a thin film architecture, the size of the battery can be substantially reduced compared to conventional rechargeable batteries, resulting in a lighter, more flexible battery with a higher energy density, higher power density, and a longer lifetime. For example, thin film lithium-ion batteries have been developed using lithium-oxide complexes, such as $LiCoO_2$, as cathodes and lithium-ion conducting electrolytes, such as lithium phosphorous oxynitride (LiPON). Such batteries are readily used in portable electronic devices such as smart phones, tablets, and laptops.

However, conventional thin film, solid-state batteries exhibit dimensional and processing limitations that inhibit further performance improvements. For example, thin film lithium-ion batteries require film thicknesses of at least 10 µm for operation. A thin film battery can also include a separator, in addition to the cathode, anode, and solid electrolyte, as well as other electronics components, e.g., capacitors, to augment the performance, particularly for high power applications. Based on the constraints imposed on the thickness of each constituent layer and the numerous materials used, the miniaturization of conventional thin film batteries is limited to tens of microns. The size limitation fundamentally limits the performance of the battery technology and limits the manner in which thin film batteries are integrated with electronic devices. For example, conventional thin film batteries are typically standalone components with interconnects that couple the battery to the device. Furthermore, the manufacture of thin film lithium-ion batteries can require numerous steps, including annealing processes at high temperatures, which increase manufacturing complexity and cost and further limits the ability to integrate batteries with electronic devices, e.g., an integrated circuit (IC).

SUMMARY

Embodiments described herein are directed to methods and an apparatus for storing energy in a solid oxide battery. The solid oxide battery may include a solid electrolyte disposed between a first electrode and a second electrode. The first electrode and the second electrode are coupled to an external source or load to charge or discharge the solid oxide battery. The solid electrolyte is formed from a proton conducting material (also referred to herein as "ionic conducting material") to transport and store hydrogen. The second electrode is formed from a noble metal that induces formation of oxygen vacancies at the interface between the second electrode and the solid electrolyte. The oxygen vacancies are used to split water molecules during charging of the solid oxide battery, which results in the generation of hydrogen. Under bias, the hydrogen ions can be transported into the solid electrolyte and stored. During discharge, a reverse process occurs where hydrogen is used to generate water and electricity.

According to some embodiments, a solid oxide battery can include a first electrode, a second electrode comprising a noble metal, and a solid electrolyte disposed between the first electrode and the second electrode, which defines an interface with the second electrode where protons generated by splitting water at the interface can be stored. The second electrode of the solid oxide battery can have a thickness of about 3 nm to about 10 nm. The first electrode of the solid oxide battery can be deposited on a flexible substrate. The solid electrolyte of the solid oxide battery can have a thickness of about 4 nm to about 100 nm and can be comprised of gadolinium oxide $(Gd_2O_{3-\delta})$ where the oxygen nonstoichiometry $\delta$ is about 0.01 to 0.5. The solid electrolyte can include an anode region bordering the second electrode, a cathode region bordering first electrode, and an electrolyte region disposed between the anode region and the cathode region. A third electrode and a second solid electrolyte can be added to the solid oxide battery where the second solid electrolyte is disposed between the second electrode and the third electrode, thus defining a second interface with the third electrode where protons generated by splitting water at the second interface can be stored.

According to some embodiments, a method of storing energy in a solid oxide battery can include: (1) splitting water into oxygen and protons at an interface between a noble metal electrode and a metal oxide of the solid oxide battery and (2) storing the protons in the metal oxide. The method can further include discharging the metal oxide battery at a rate of about 50 µW $cm^{-2}$ $µm^{-1}$ to about 2500 µW $cm^{-2}$ $µm^{-1}$ (e.g., at about 500 $µA/cm^2$ µm). The method can also include storing energy in the solid oxide battery at a density greater than 20 µWh·$cm^{-2}$ $µm^{-1}$ (e.g., about 40 $µAh/cm^2$ µm) and transferring energy to and from the metal oxide battery at a density greater than 2500 µW·$cm^{-2}$ $µm^{-1}$.

The solid oxide battery can also be integrated with electronic devices, such as an integrated circuit, due to its small form factor and CMOS compatibility. According to some embodiments, an integrated circuit can include a substrate, at least one transistor disposed on the substrate, and a battery, which is in electrical contact with the at least one transistor, that provides electrical power to at least one transistor. The battery includes a first electrode, a second electrode, and a solid electrolyte disposed between the first electrode and the second electrode. The substrate can be a flexible substrate. The transistor can be one of a plurality of transistors where the first electrode of the battery is connected to the plurality of transistors in a parallel configuration. The transistor can be a p-channel field-effect transistor where the first electrode is connected to a source of the p-channel field-effect transistor. The battery can be deposited as an overlayer over the transistor. The solid electrolyte of the battery can store protons generated by splitting water at an interface between the second electrode and the solid electrolyte. The first electrode can be connected to a source of the at least one transistor. The solid electrolyte can have a thickness of about 4 nm to about 100 nm.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 10A is a top-down view of a solid oxide battery as manufactured.

FIG. 10B is a top-down view of the solid oxide battery from FIG. 10A after charging under vacuum at a pressure of $3 \times 10^{-6}$ bar.

FIG. 10C is a top-down view of the solid oxide battery from FIG. 10A after charging under dry $O_2$.

FIG. 10D is a top-down view of the solid oxide battery from FIG. 10A after charging under dry $N_2$.

FIG. 10E is a top-down view of the solid oxide battery from FIG. 10A after charging under wet $N_2$.

DETAILED DESCRIPTION

The Inventors have recognized a desire for simpler, smaller batteries that can be more easily integrated with existing electronic devices. The present disclosure thus describes a solid oxide battery to store energy in a form factor smaller than conventional thin-film battery technologies using a simpler architecture. The solid oxide battery can include a solid electrolyte, a first electrode, and a second electrode. The solid electrolyte can have substantially reduced dimensions, e.g., a thin film, a pillar, a particle, that functions as the anode, cathode, and electrolyte in the battery, thus simplifying design and manufacturing. The solid oxide battery can provide an energy density comparable to and a power density exceeding conventional thin film lithium-ion batteries. The solid oxide battery can be as thin as approximately 10 nm, which is several orders of magnitude thinner than conventional thin film lithium-ion batteries. The solid oxide battery can also be compatible with complementary metal-oxide-semiconductor (CMOS) fabrication processes. In this manner, solid oxide batteries disclosed herein can be simpler to manufacture, substantially thinner than conventional thin film batteries, and more easily integrated into electronic devices, such as IC's.

Figure 1:
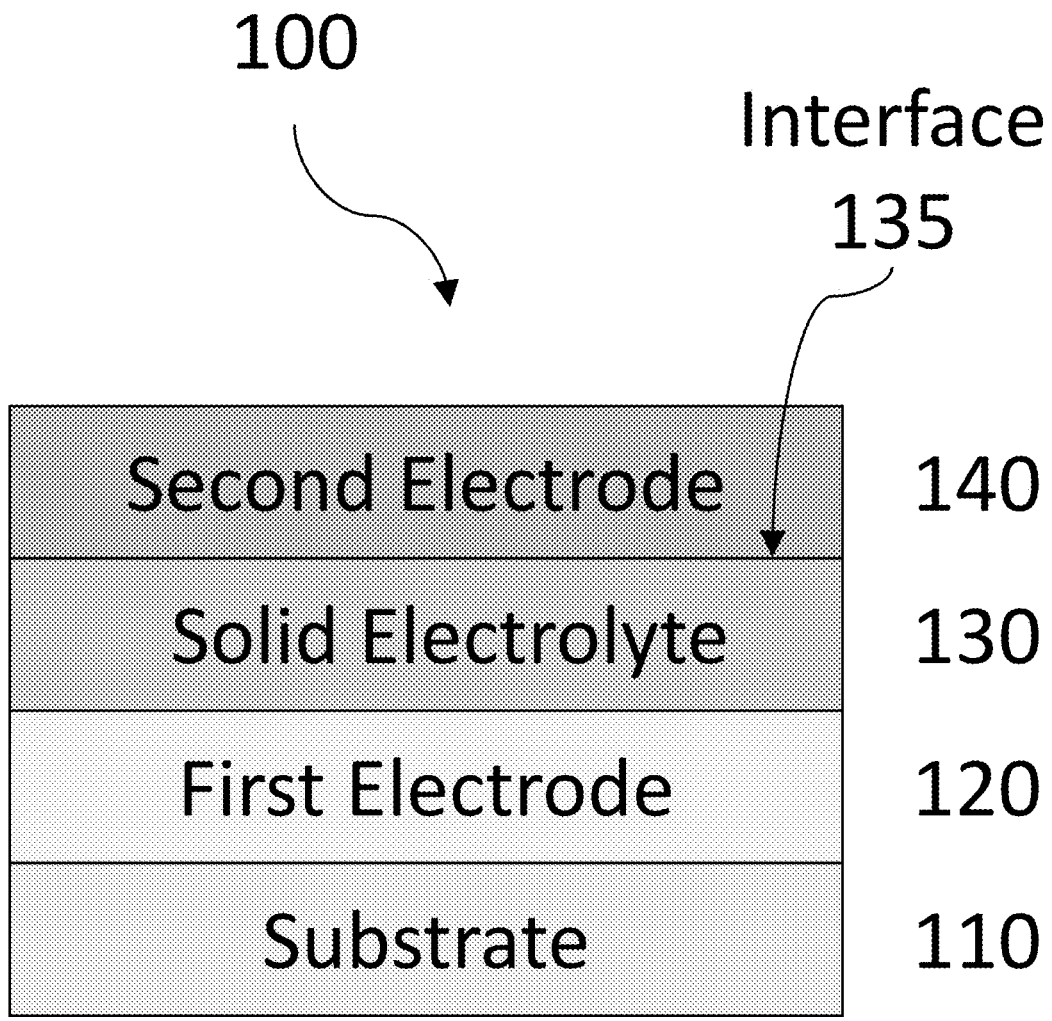
FIG. 1 is a schematic illustration of a solid oxide battery.

FIG. 1 shows an exemplary embodiment of a solid oxide battery 100. The solid oxide battery 100 can include a substrate 110 to mechanically support the other layers of the solid oxide battery 100. A first electrode 120 can be disposed onto the substrate 110 to electrically couple the solid oxide battery 100 to an electrical source or load. A solid electrolyte 130 can then be disposed on and electrically coupled to the first electrode 120. In operation, the solid electrolyte 130 acts as a storage layer. A second electrode 140 can then be disposed on and electrically coupled to an exposed portion of the solid electrolyte 130. The combination of the second electrode 140 and the first electrode 120 can be used to apply an electric field across the solid electrolyte 130 to facilitate charging and discharging of the solid oxide battery 100.

The solid oxide battery 100 can operate by splitting water molecules into hydrogen and hydroxyl ions and storing hydrogen as chemical energy in the solid electrolyte 130. The water that acts as a source of hydrogen can be acquired from the surrounding air at the electrolyte/noble-metal/air interface or from liquid water or gel in contact with the electrolyte/noble-metal interface 135. The storage of hydrogen is preferable because the smaller atomic diameter of hydrogen allows hydrogen to more readily transport through various media, which can improve charge and discharge rates. The transport of hydrogen is also less likely to damage the atomic lattice of surrounding media, thus improving the lifetime of the solid oxide battery 100. Furthermore, more hydrogen molecules can be stored per unit volume, thus the energy density of the solid oxide battery 100 can be higher than conventional solid-state batteries.

Figure 2:
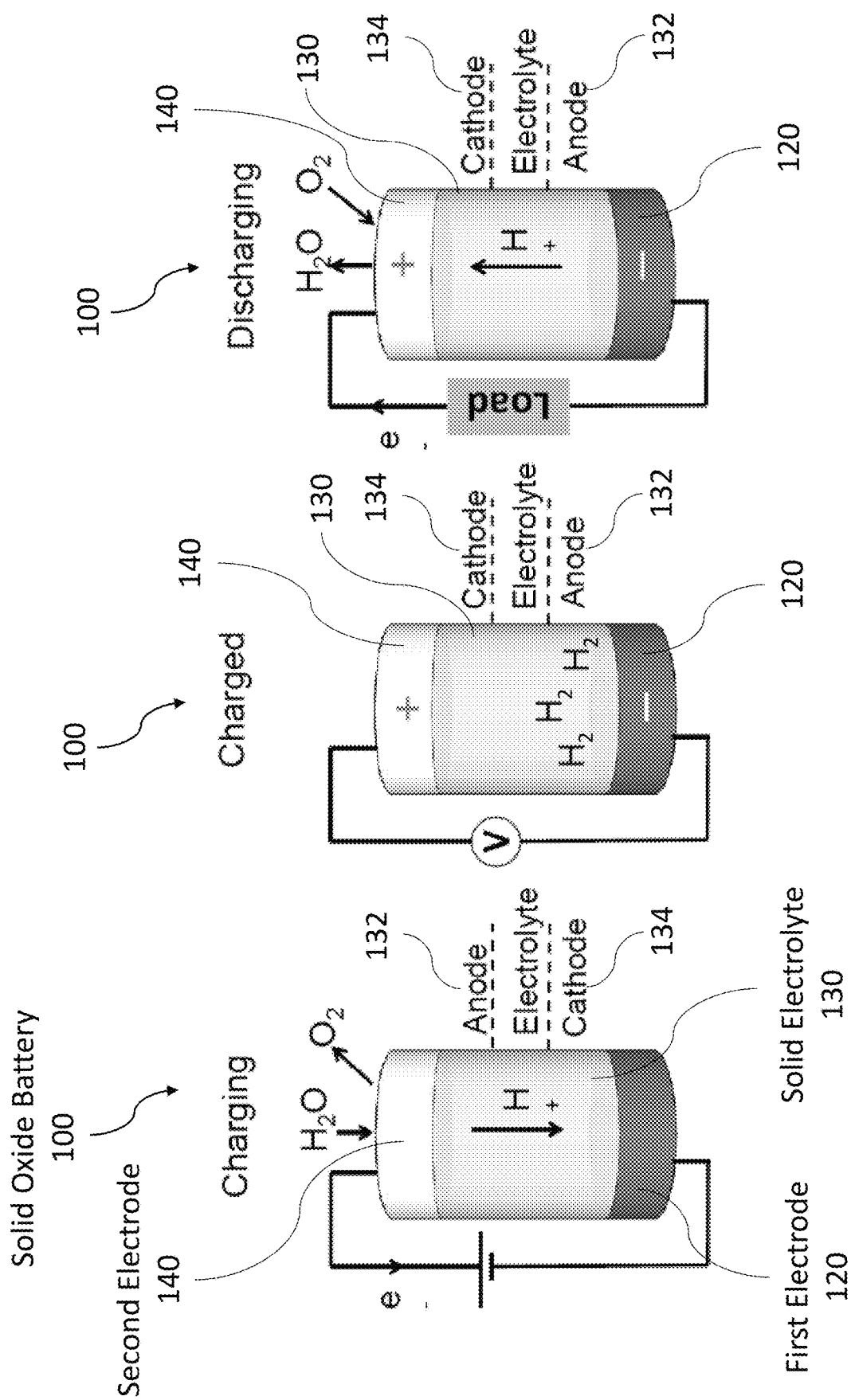
FIG. 2A is a schematic illustration of a solid oxide battery during a charging process.
FIG. 2B is a schematic illustration of the solid oxide battery from FIG. 2A when charged.
FIG. 2C is a schematic illustration of the solid oxide battery from FIG. 2A during a discharge process.

An exemplary charging process of the solid oxide battery 100 is shown in FIG. 2A. The interface 135 between the second electrode 140 and the solid electrolyte 130 can be configured to support oxygen vacancies in the solid electrolyte 130 proximate to the interface 135. When water molecules, $H_2O$, contact the interface 135, the oxygen vacancies can cleave $H_2O$, resulting in the formation of hydrogen ions, $H^+$, and hydroxyl ions, $OH^-$. The $H^+$ ions can then be driven towards the first electrode 120 by an electric field between the first electrode 120 and the second electrode 140. The $H^+$ ions can then combine with electrons near the first electrode 120 to form a hydrogen molecule, $H_2$. Hydrogen, $H_2$, can then be stored as a pocket of gas or as impurity interstitials in the lattice of the solid electrolyte 130 as shown in FIG. 2B. The chemical reactions of the exemplary charging process are shown below:

$$\text{Anode: } 4H_2O \rightarrow 4H^+ + 4OH^- \quad (1)$$

$$\text{Anode: } 4OH^- \rightarrow 2H_2O + 4e^- + O_2 \quad (2)$$

$$\text{Cathode: } 4H^+ + 4e^- \rightarrow 2H_2 \quad (3)$$

where the anode 132 is a portion of the solid electrolyte 130 proximate to the second electrode 140 and the cathode 134 is a portion of the solid electrolyte 130 proximate to the first electrode 120.

The process of discharging the solid oxide battery 100 can involve recombining the stored hydrogen with oxygen to form water molecules and, in the process, produce electricity. An exemplary discharging process of the solid oxide battery 100 is shown in FIG. 2C and the corresponding chemical reactions are shown below:

$$\text{Anode: } 2H_2 \rightarrow 4H^+ + 4e^- \quad (4)$$

$$\text{Cathode: } 2H_2O + 4e^- + O_2 \rightarrow 4OH^- \quad (5)$$

$$\text{Cathode: } 4H^+ + 4OH^- \rightarrow 4H_2O \quad (6)$$

As shown in EQN. 5, water and oxygen should be present in order to facilitate the formation of $OH^-$ ions, which can then recombine with $H^+$ ions to form $H_2O$.

Substrate

The substrate 110 can be used as mechanical support to facilitate the manufacture and operation of the solid oxide battery 100. The substrate 110 can be a blank component with a substantially flat surface to support the solid oxide battery 100. For example, the substrate 110 can be a bare silicon wafer that supports one or more solid oxide batteries 100. In another example, the substrate 110 can be formed from a flexible material, such as polyimide or polyether ether ketone (PEEK), which supports one or more solid oxide batteries 100. In order to ensure each solid oxide battery 100 is electrically isolated, an electrically insulating layer, e.g., $SiO_2$, can be disposed onto the substrate 110 prior to the fabrication of the solid oxide battery 100. The substrate 110 can also be compatible with conventional complementary metal-oxide-semiconductor (CMOS) processes, thus conventional fabrication facilities can be used to fabricate the solid oxide battery 100.

First Electrode

The first electrode 120 can be disposed between a portion of the substrate 110 and the solid electrolyte 130 and coupled to an external source or load to facilitate the charging or discharging, respectively, of the solid oxide battery 100. The first electrode 120 can be formed from various electrically conductive materials that do not readily oxidize. For example, the first electrode 120 can be formed from various conductive materials including, but not limited to Pd, Ag, Pt, and Au. The first electrode 120 can be a thin film with sufficient thickness, e.g., approximately 10 nm, such that a continuous film can be reliably manufactured. To improve the adhesion of the first electrode 120 to the substrate 110, an adhesion layer may be deposited onto the substrate 110 prior to the deposition of the first electrode 120. For example, a thin Ta layer, e.g., 4 nm thick, can be deposited onto the silicon substrate 110 prior to depositing a 10 nm thick Pt layer as the first electrode 120. The first electrode 120 can be formed using various deposition methods, including, but not limited to, sputtering, e-beam evaporation, pulsed laser deposition, and chemical vapor deposition. Once deposited, the first electrode 120 can be patterned using various lithographical methods, including, but not limited to, shadow mask lithography, e-beam lithography, photolithography, and x-ray lithography.

Solid Electrolyte

The solid electrolyte 130 can be disposed between the first electrode 120 and the second electrode 140 such that an electric field can be applied across the solid electrolyte 130. The solid electrolyte 130 supports the formation of oxygen vacancies when in contact with the second electrode 140. As described above, the oxygen vacancies can assist with cleaving the $H_2O$ molecules to form $H^+$ and $OH^-$ ions during charging. The solid electrolyte 130 can have a low electrical conductivity with few activated electrons at room temperature, a high ionic conductivity to facilitate the transport of hydrogen, and store hydrogen as pockets of gas or as impurity interstitials within the lattice of the solid electrolyte 130.

The solid electrolyte 130 can be formed from various metal oxide materials with an open structure, e.g., a solid oxide with a bixbyite structure, including, but not limited to, $Gd_2O_3$, $Y_2O_3$, and $ZrO_2$. If the solid electrolyte 130 is a solid oxide electrolyte, it may be partially hydrated, so that it is intermediate between $Gd_2O_{3-\delta}$ and $Gd(OH)_3$. It may be a rare earth oxide $RE_2O_{3-\delta}$, where RE is any one of (La, Pr, Nd, Sm, Eu, Gd, Tb, Ho, Yb, Y). The oxide electrolyte may alternatively include a mixture of two or three of these rare earth elements. The rare earth oxide may further incorporate water so as to be intermediate between $RE_2O_{3-\delta}$ and $RE(OH)_3$. The oxide electrolyte may have a crystal structure corresponding to the bixbyte structure. The oxide electrolyte may be an oxide or mixed hydroxide including one or more transition metal elements, including Ta, V, W, Zr, Hf, Ti, Nb, Mn, Cr. Other suitable solid electrolyte materials include perovskite materials that are proton conductors, such as $BaCe_{1-x}M_xO_{3-\delta}$ or $BaZr_{1-x}M_xO_{3-\delta}$ where M is Y or Yb.

A differentiating feature of the solid oxide electrolyte 130 is that it facilitates water splitting, proton transport, and proton storage at ambient temperature, as opposed to solid oxide electrolysis cells, which are generally restricted to operation at high temperatures (>300° C. and usually >600° C.). As a result, the battery 100 can operate at temperatures ranging from about 10° C. to about 300° C.

To work properly, the solid oxide 130 should be hydrated, e.g., by exposing the oxide to water vapor before depositing the second electrode 140. This hydration transforms the solid oxide 130 from $RE_2O_3$ to a partially hydrated form, $RE_2O_3$—$RE(OH)_3$.

Second Electrode

The second electrode 140 can be disposed on a portion of the solid electrolyte 130 and coupled to an external source or load to facilitate the charging or discharging, respectively, of the solid oxide battery 100. The second electrode 140 can be formed from any of a variety of metals (e.g., Au, Ag, Pt, Pd, Ir, Rh, Cu, Ni) or alloys of these such metals. It is configured to induce a formation of oxygen vacancies at the interface 135 between the second electrode 140 and the solid electrolyte 130. The interface between the electrode and the solid oxide electrolyte can facilitate water splitting at low temperature (between about 10° C. and 300° C.).

The size and shape of the solid oxide battery 100 can be determined by the lateral dimensions of the second electrode 140. For example, the second electrode 140 can be patterned after deposition to form a plurality of solid oxide batteries 100 on the substrate 110, where the portions of the second electrode 140 remaining after patterning determines the size of each solid oxide battery 100. The second electrode 140 can have lateral dimensions of at least 2 mm by 2 mm. For some applications, lateral dimensions that are much smaller would be desirable, e.g., lateral dimensions of 20 nm by 20 nm. Other applications may benefit from a large aspect ratio, giving a wider second electrode 140, e.g., 0.1 mm by 10 mm. Finally, much larger dimensions can also be desired for the battery, up to centimeters or even more.

The second electrode 140 can be formed using various deposition methods, including, but not limited to, sputtering, e-beam evaporation, pulsed laser deposition, and chemical vapor deposition. Once deposited, the second electrode 140 can be patterned using various lithographical methods, including, but not limited to, shadow mask lithography, e-beam lithography, photolithography, and x-ray lithography.

As described above, the operation of the solid oxide battery 100 is predicated on the transfer of water molecules from an external source, e.g., the ambient environment, or a water-based sol gel layer, to the interface 135. The second electrode 140 can thus be configured to have a high enough effective diffusivity to achieve charging times of an hour or less. The effective diffusivity of the second electrode 140 can be increased by altering the morphology and the geometry of the second electrode 140. For example, the thickness of the second electrode 140 can be reduced, e.g., from 10 to 3 nm. The density of the second electrode 140 can also be reduced by adjusting various deposition parameters, including deposition rate and deposition temperature. The second electrode 140 can also be patterned after deposition to have a plurality of openings of sufficient size to allow water molecules to pass through the second electrode 140. In some instances, the second electrode 140 can be formed by depositing a colloidal film of noble metal nanoparticles arranged such that openings form between adjacent nanoparticles.

Fabricated Solid Oxide Batteries

Figure 3:
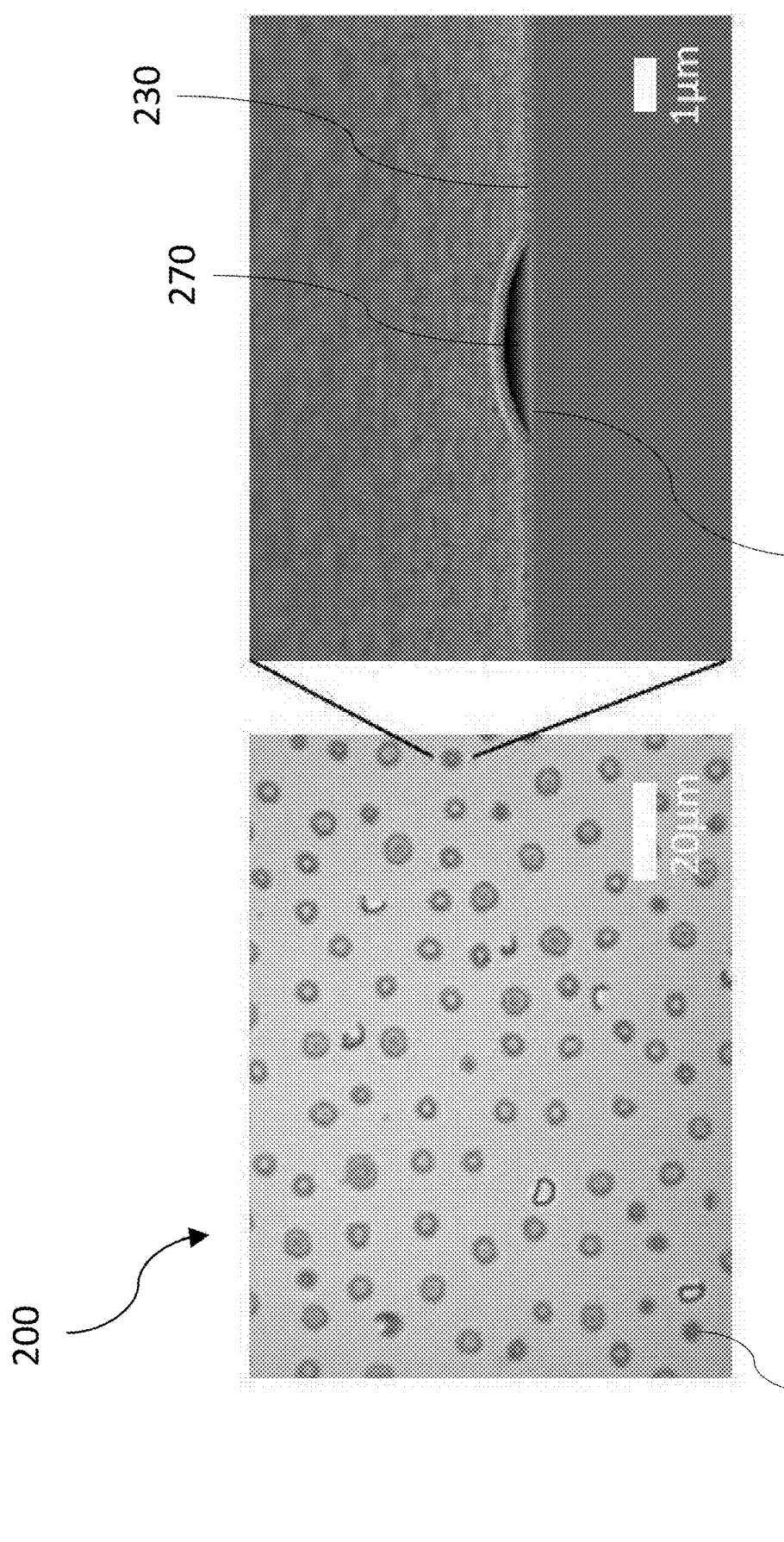
FIG. 3A is a top down view of a solid oxide battery with a 100 nm thick $GdO_x$ layer after charging at +3V for 5 hours.
FIG. 3B is a cross-sectional view of a gas pocket in the solid oxide battery shown in FIG. 3A.

FIG. 3A shows an exemplary solid oxide battery 200 with a 100 nm thick $GdO_x$ layer as the solid electrolyte 230. The solid oxide battery 200 was charged for 5 hours at +3 V. The generation of hydrogen during charging resulted in the formation of several gas pockets 270. FIG. 3B shows a cross sectional view of the solid oxide battery 200 where the gas pocket 270 is shown to have formed between the solid electrolyte 230 and the first electrode 220. This indicates that hydrogen ions were driven towards the first electrode 220 due to the applied bias during charging.

Compared to conventional thin film lithium-ion batteries, the simpler architecture of the solid oxide battery 100 can allow substantial reductions in the thickness of the solid electrolyte 130, e.g., down to 20 nm. The solid electrolyte 130 can also be formed to have other shapes, including, but not limited to, micropillars, spheroids, and ellipsoids. For these other geometries, the solid electrolyte 130 should be dimensioned such that the ionic continuity between the second electrode 140 and the first electrode 120 is maintained. The solid electrolyte 130 can be formed using various deposition methods, including, but not limited to, sputtering, e-beam evaporation, pulsed laser deposition, and atomic layer deposition. The crystal structure of the solid electrolyte 130 can affect the hydrogen storage capacity and thus may be tuned via by adjusting the deposition method to change the crystalline quality of the material, e.g., substantially polycrystalline, substantially amorphous. Once deposited, the solid electrolyte 130 can be patterned using various lithographical methods, including, but not limited to, shadow mask lithography, e-beam lithography, photolithography, and x-ray lithography.

Figure 4:
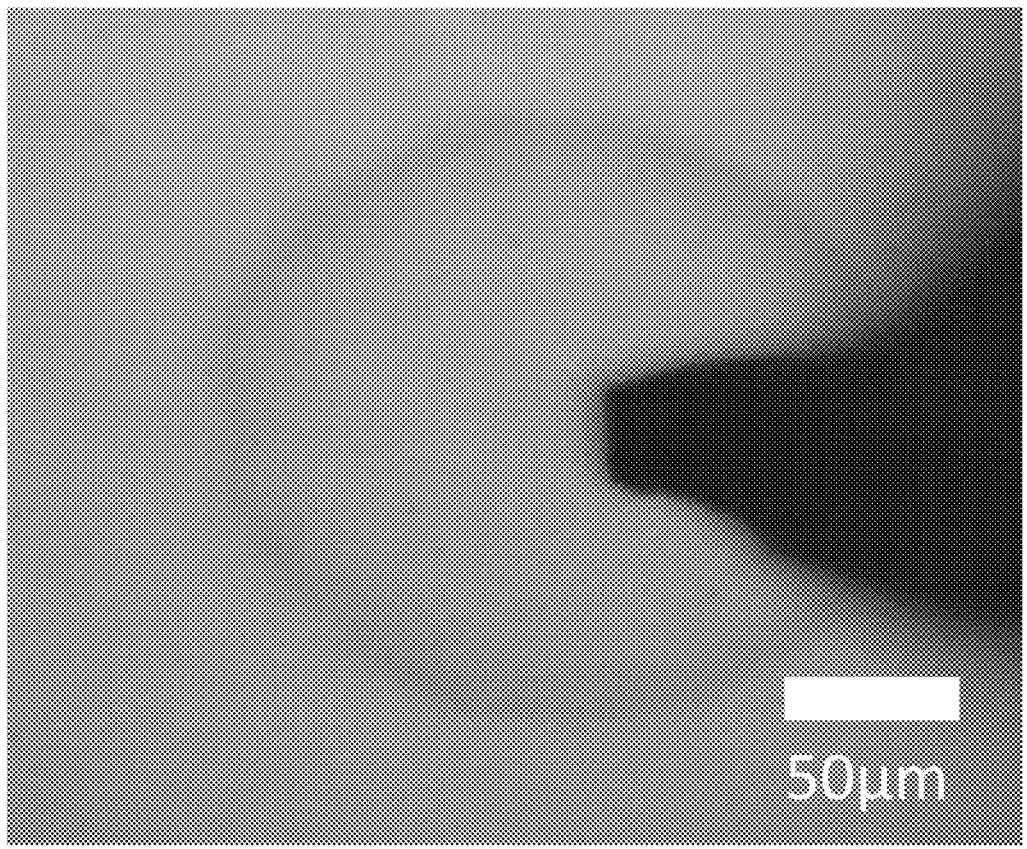
FIG. 4 is top-down view of a solid oxide battery.

FIG. 4 shows an image detailing the lateral shape and dimensions of an exemplary solid oxide battery. The solid oxide battery shown in FIG. 4 was fabricated where the substrate was a thermally oxidized Si (100) substrate. The first electrode was then formed on the substrate by first depositing 4 nm of Ta as an adhesion layer followed by 10 nm of Pt using DC magnetron sputtering at room temperature and under 3 mTorr of argon and a background pressure of $5 \times 10^{-7}$ Torr. This was followed by the deposition of the solid electrolyte. $GdO_x$ was deposited at various thicknesses, e.g., 10 nm, 20 nm, using radio frequency (RF) sputtering at a power of 100 W under an oxygen partial pressure of 0.6 mTorr. Then, 3 nm of Au was deposited onto the solid electrolyte as the second electrode using RF sputtering. The first electrode was then patterned using shadow mask lithography to form solid oxide batteries of varying diameter, e.g., 90 μm, 200 μm.

Performance

Figure 5:
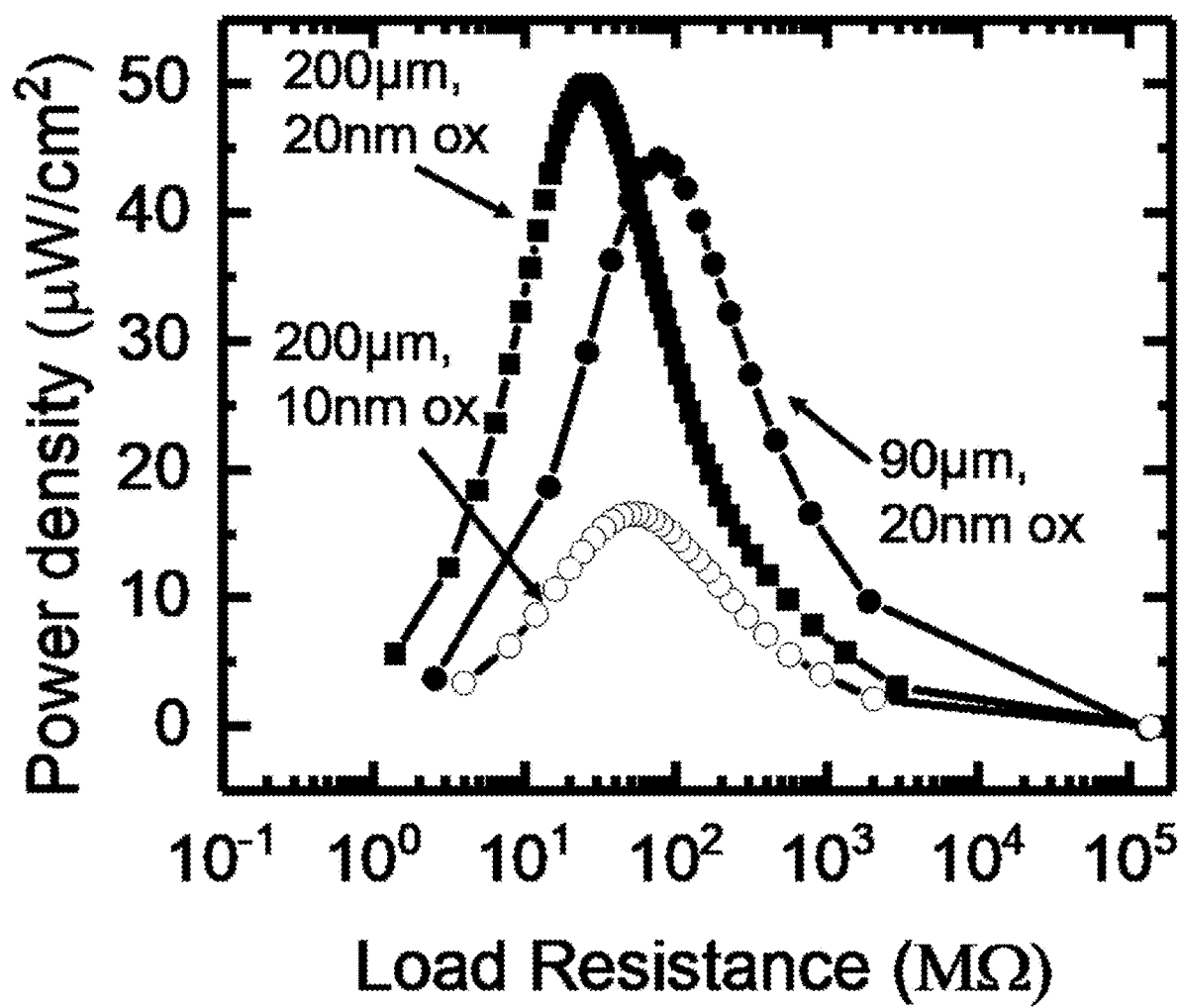
FIG. 5 shows power density curves for several solid oxide batteries with various dimensions.

The performance of the solid oxide battery can be generally characterized by several parameters related to the energy density, power density, and the lifetime. FIG. 5 shows the power density curve as a function of a load resistance for three solid oxide batteries with varying dimensions summarized as follows: (I) diameter of the solid oxide battery, D=200 μm, thickness of solid electrolyte, $t_{elec}$=20 nm (II), D=90 μm, $t_{elec}$=20 nm, and (III) D=200 μm, $t_{elec}$=10 nm. Each battery was charged by applying +3V to the second electrode and connecting the first electrode to ground for 40 minutes in air with 60% humidity. The output power was then normalized by the lateral area to yield the power density.

The peak power density of battery (I) is 50 μW/cm² at a load resistance of 28.1 MΩ. Battery (II) exhibits a similar peak power density of 44.2 μW/cm² at a load resistance of 80 MΩ, which is an indication that the solid oxide battery can be scalable in terms of area. Battery (III), however, exhibits a peak power density of 16.5 μW/cm² at a load resistance of 80 MΩ, which is less than half that observed for battery (I). The performance of battery (III) suggests the power density of the solid oxide battery is highly sensitive to the thickness of the solid electrolyte.

Figure 6:
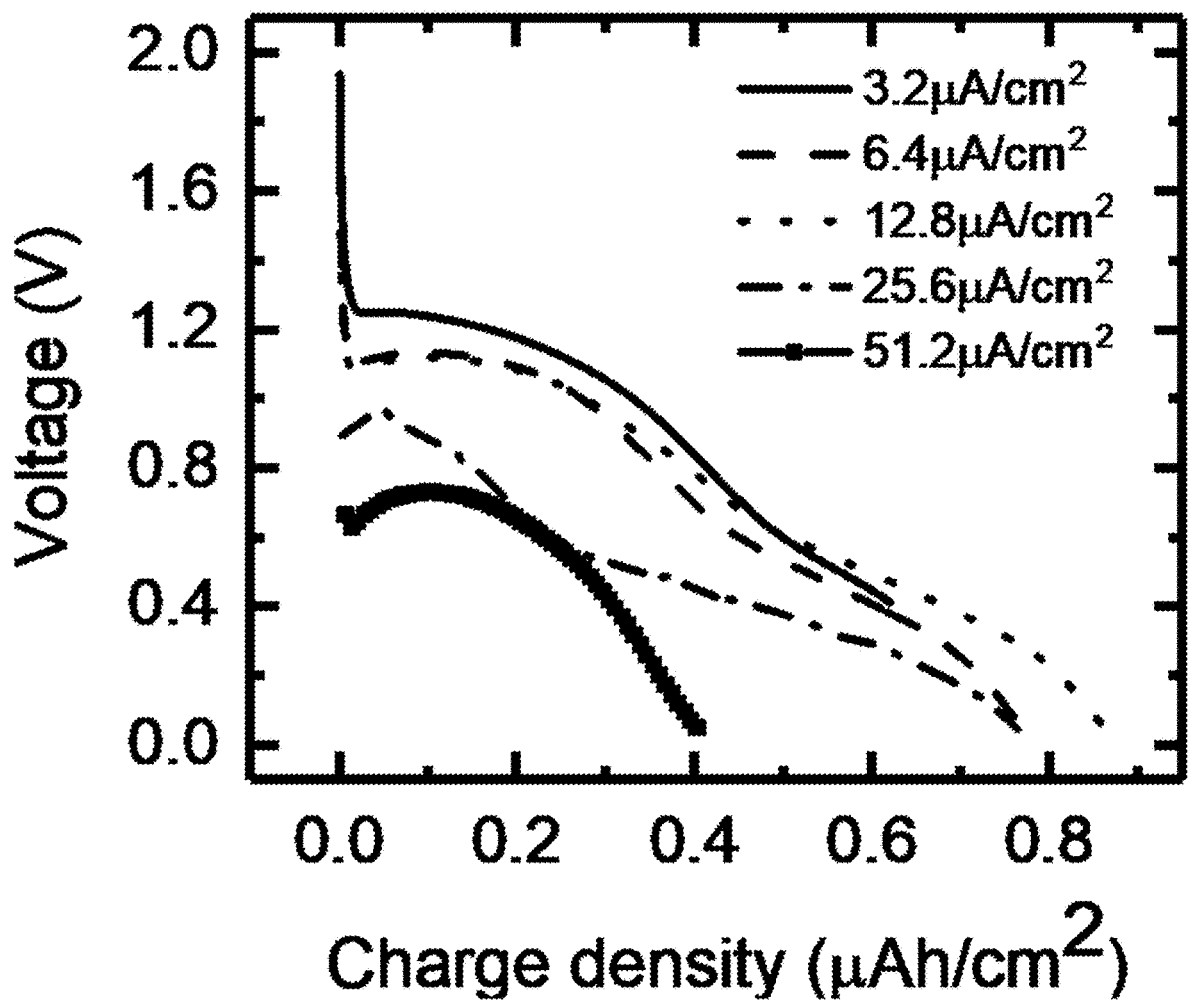
FIG. 6 shows discharge curves at various discharge rates for a 200 μm diameter solid oxide battery with a 20 nm thick layer of $GdO_x$.

FIG. 6 shows the discharge curves of battery (I) at various discharge rates. The discharge rates were varied from 3.2 μA/cm² to 51.2 μA/cm². At low discharge rates, the curves can exhibit a plateau between 1 to 1.2 V before decaying gradually to 0. At high discharge rates, the voltage and charge density obtained from battery (I) are lower, which is similar to the discharge characteristics of other batteries.

Figure 7:
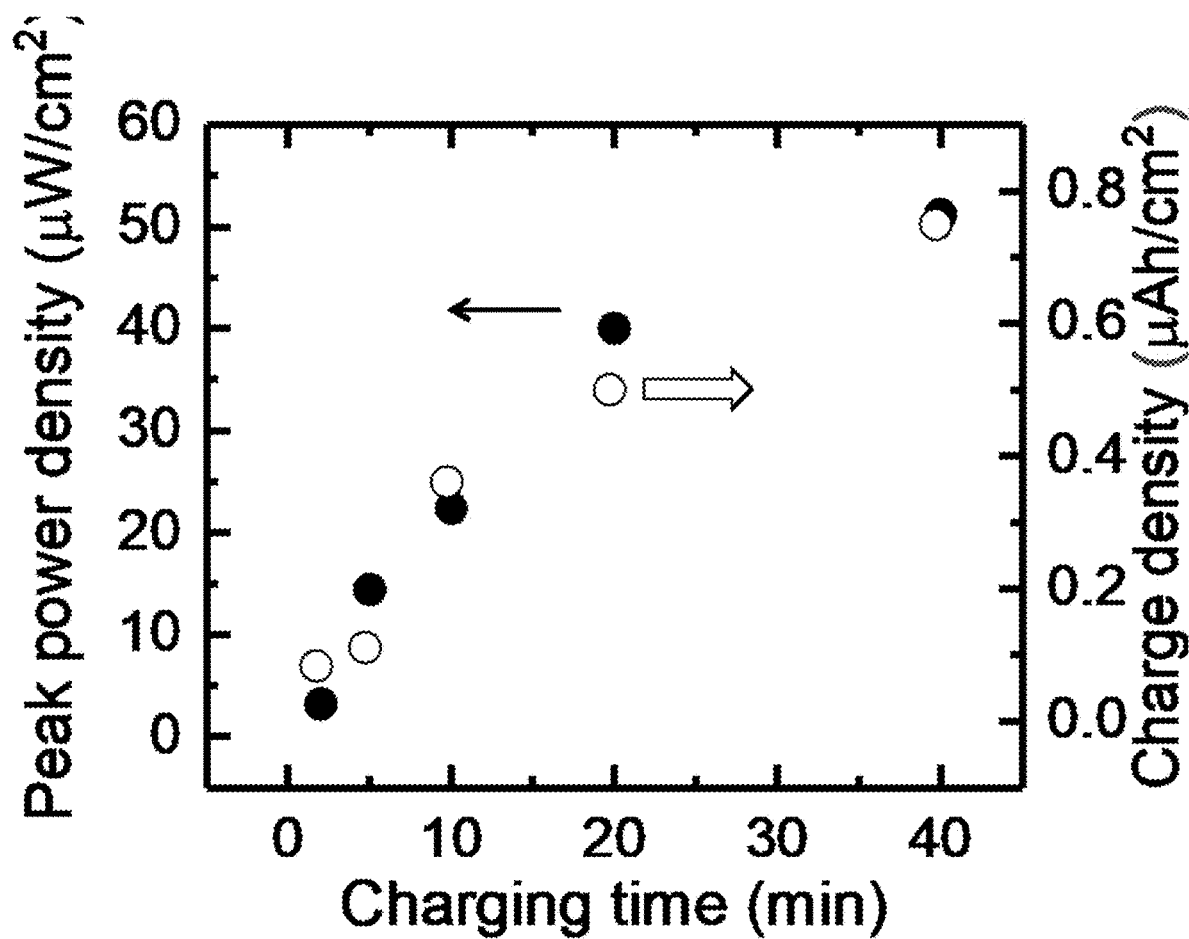
FIG. 7 shows the peak power density and charge densities of a solid oxide battery as a function of charging time at +3V.

FIG. 7 shows a summary of the peak power and charge density from battery (I) as a function of charging time at +3 V. The data points exhibit a sigmoidal shape where the slope is initially large for short charging times before saturating at longer charging times. As shown in FIG. 7, the peak power density and charge density for the exemplary battery (I) can saturate at 50 $\mu W/cm^2$ and 0.74 $\mu Ah/cm^2$, respectively.

Figure 8:
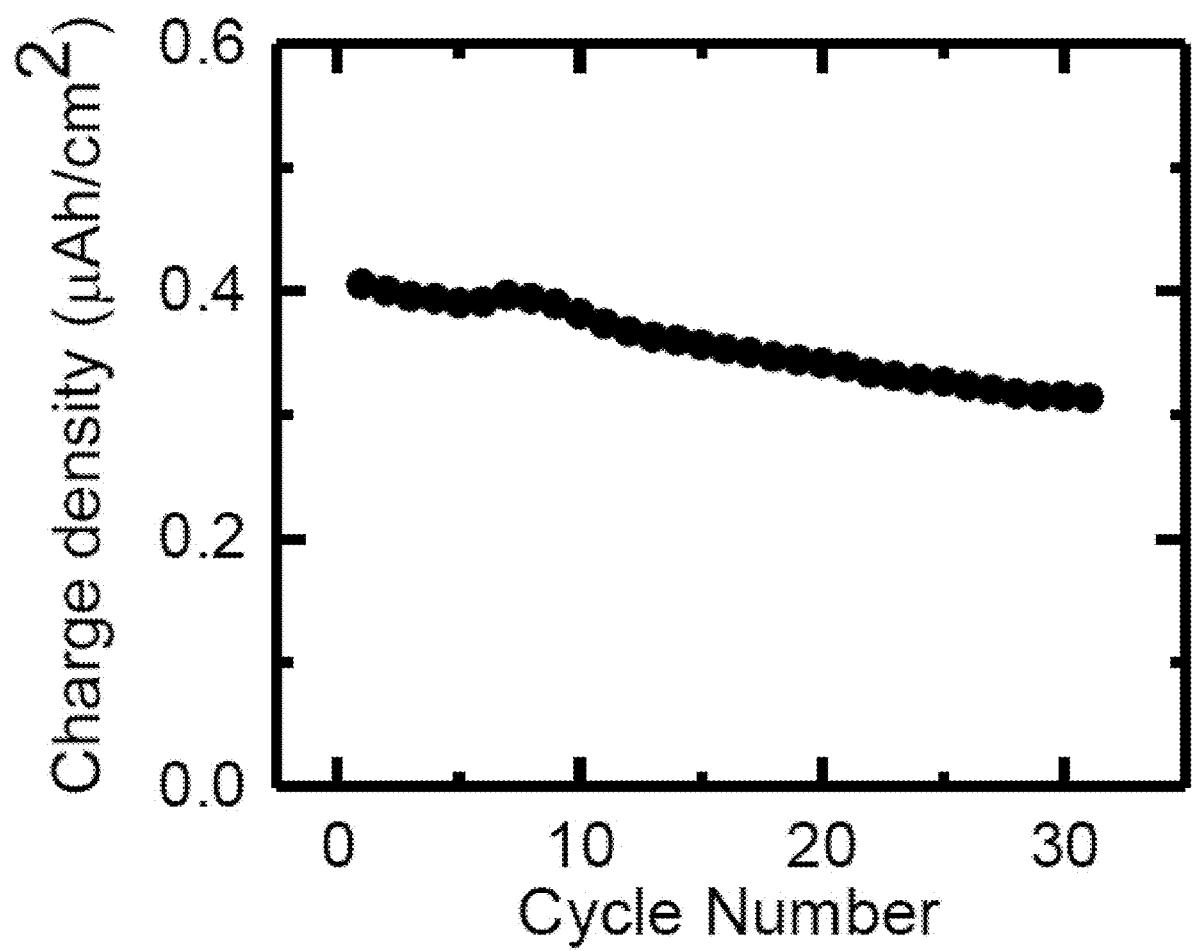
FIG. 8 shows the charge density of a solid oxide battery as a function of cycle number.

FIG. 8 shows the charge density as a function of the cycle number for battery (I). Battery (I) was charged for 20 minutes in each cycle. Battery (I), which includes a 20 nm thick solid electrolyte, retains 75% of the maximum charge capacity even after 30 charging cycles, with no indications of breakdown.

Figure 9:
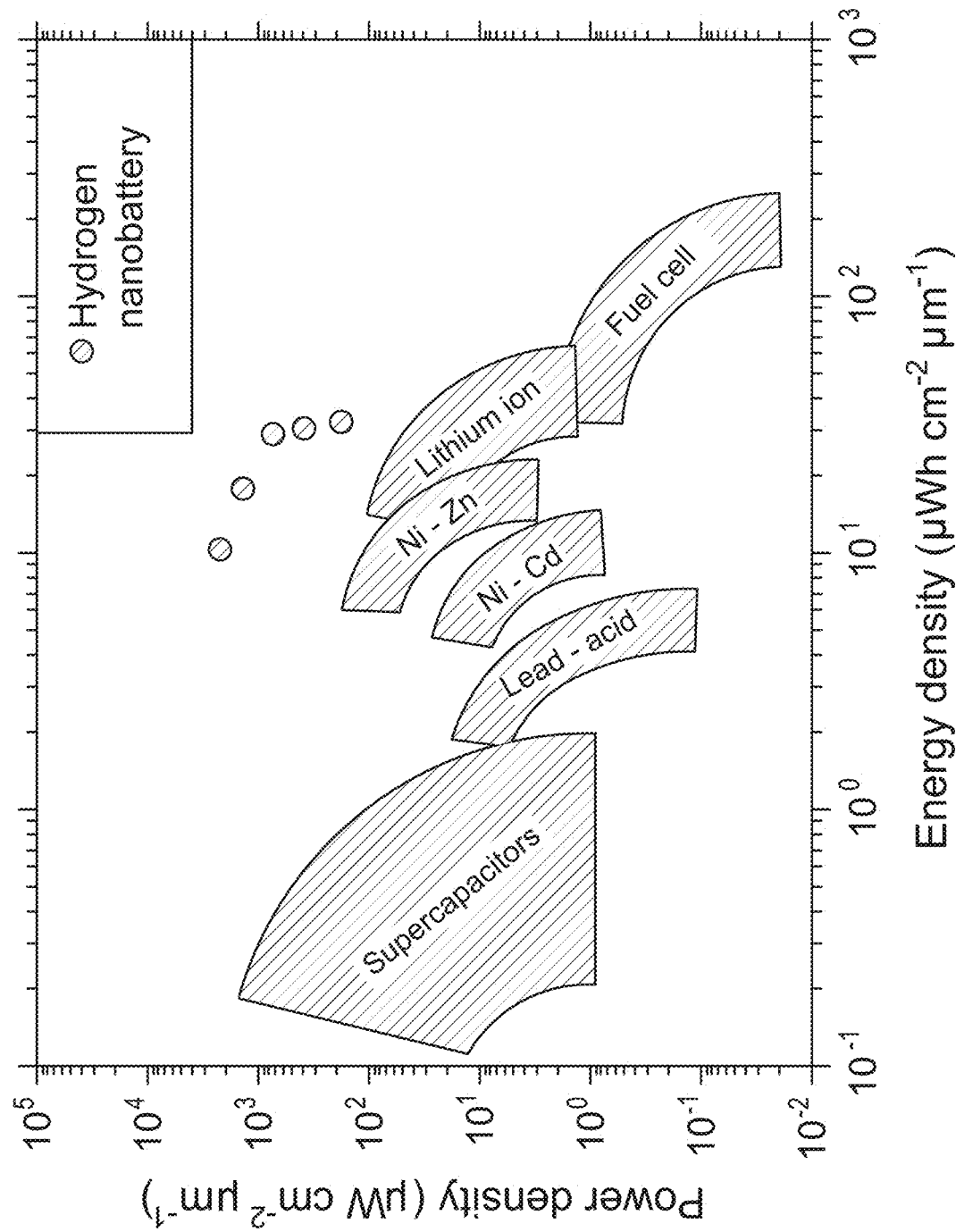
FIG. 9 shows a comparison of the power density and energy density of the solid oxide batteries to those of other battery technologies.

Based on these measurements, the performance of the exemplary solid oxide battery can be compared to conventional battery technologies and storage systems. FIG. 9 shows the volumetric power density and the energy density of various energy storage technologies and several exemplary solid oxide batteries. Among the exemplary solid oxide batteries characterized, the peak volumetric power density can be as high as 2500 $\mu W/cm^2$ $\mu m$, which is larger than supercapacitors and nearly ten times higher than conventional lithium-ion batteries. The energy density of the exemplary solid oxide batteries is also shown to be comparable to conventional lithium-ion batteries with values ranging between 10-30 $\mu Wh/cm^2$ $\mu m$.

Ambient Conditions

The solid oxide battery, as shown in EQNS. 1-6, utilizes chemical reactions involving water, oxygen, and hydrogen during charging and discharging processes. According to some embodiments, water can originate from the ambient environment surrounding the solid oxide battery. Since the solid oxide battery does not need to store the reactants, the solid oxide battery can have smaller dimensions, a lower weight, and a higher energy density. Metal air batteries can operate in a similar manner but are substantially larger in size and typically use a liquid electrolyte. In contrast, the solid oxide battery described herein is substantially thinner, which can at least improve the kinetics of ion transfer.

To demonstrate that the solid oxide battery can operate by reacting with water from the ambient environment, an exemplary solid oxide battery's performance was measured after charging under various ambient conditions. The exemplary solid oxide battery included a 20 nm thick $GdO_x$ layer as the solid electrolyte and was 200 $\mu m$ in diameter. FIG. 10A shows the exemplary solid oxide battery as manufactured. FIGS. 10B-10E show the exemplary solid oxide battery charged at $3 \times 10^{-6}$ bar, under dry $O_2$, under dry $N_2$, and under wet $N_2$, respectively. The solid oxide battery was disposed inside a chamber, e.g., a Lakeshore CPX-VF probe station, which can be evacuated. The dry $O_2$ and $N_2$ environments were created by flowing the respective gases into the chamber containing the solid oxide battery. For the wet $N_2$ case, humidity was introduced by bubbling $N_2$ gas through water in a gas bubbler and then flowing wet $N_2$ gas into the chamber containing the solid oxide battery.

As shown in FIG. 10E, the color of the solid oxide battery exhibits an appreciable change only for the case when charging was performed under wet $N_2$. For the other cases, the appearance of the solid oxide battery did not appreciably change. This is an indication the presence of water in the wet $N_2$ case resulted in the generation of hydrogen. The hydrogen products were then stored in the solid electrolyte, which resulted in a change in the refractive index and hence the change in color of the solid oxide battery in the case of wet $N_2$.

Figure 11:
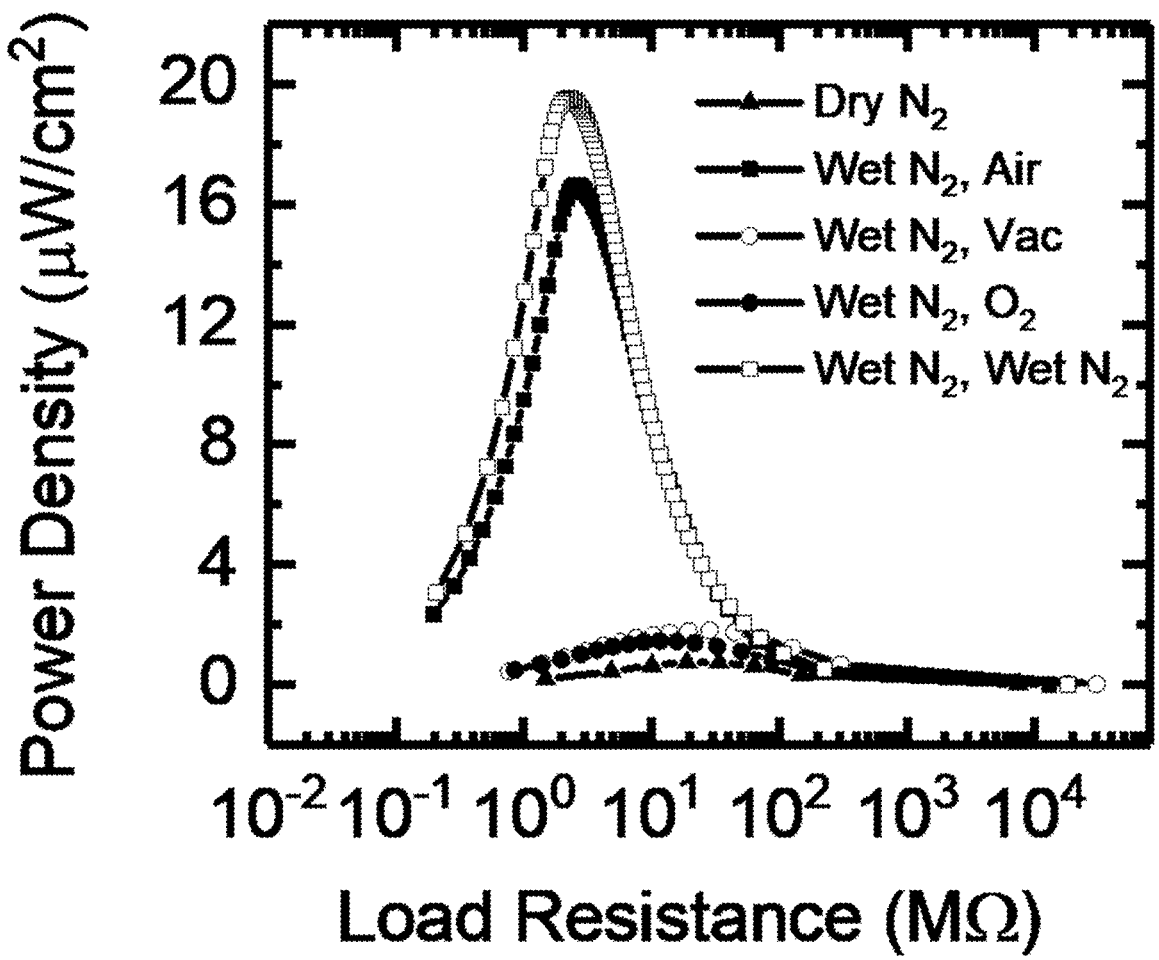
FIG. 11 shows the power density curves for various solid oxide batteries discharged under various atmospheric conditions.

The solid oxide battery was then discharged under various ambient conditions. FIG. 11 shows the power density as a function of the load resistance for several cases where the solid oxide battery was charged under either dry $N_2$ for 40 minutes (case I) or wet $N_2$ for 30 seconds (cases II-V). For cases II-V, the solid oxide battery was discharged under air, vacuum at $3 \times 10^{-6}$ bar, dry $O_2$, and wet $O_2$, respectively. As shown, the power density was highest for the cases where the solid oxide battery was charged under wet $N_2$ and discharged under either air or wet $O_2$. This provides further evidence that the presence of water in the environment during charging can result in the generation of hydrogen in the solid oxide battery. For the cases where discharge occurred under air or wet $O_2$, the higher power density can be attributed again to the presence of water in the environment, which is used to form hydroxyl ions that then combine with hydrogen to form water, as shown in EQNS. 4-6. In the cases where discharge was performed under vacuum or dry $O_2$, the absence of water in the environment limited the formation of hydroxyl ions and hence prevented the formation of water and electricity.

Figure 12A:
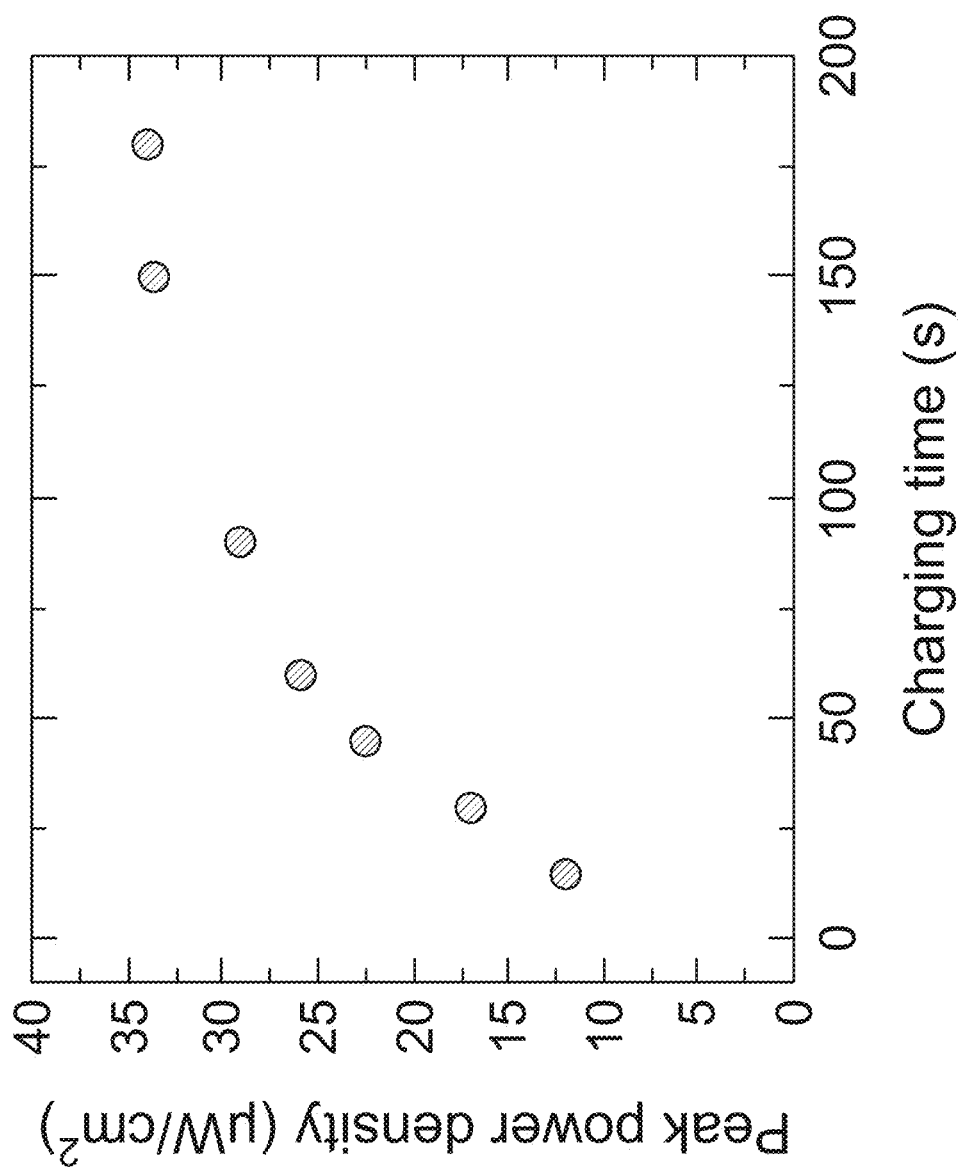
FIG. 12A shows the peak power density of a solid oxide battery as a function of charging time under wet $N_2$ conditions.
Figure 12B:
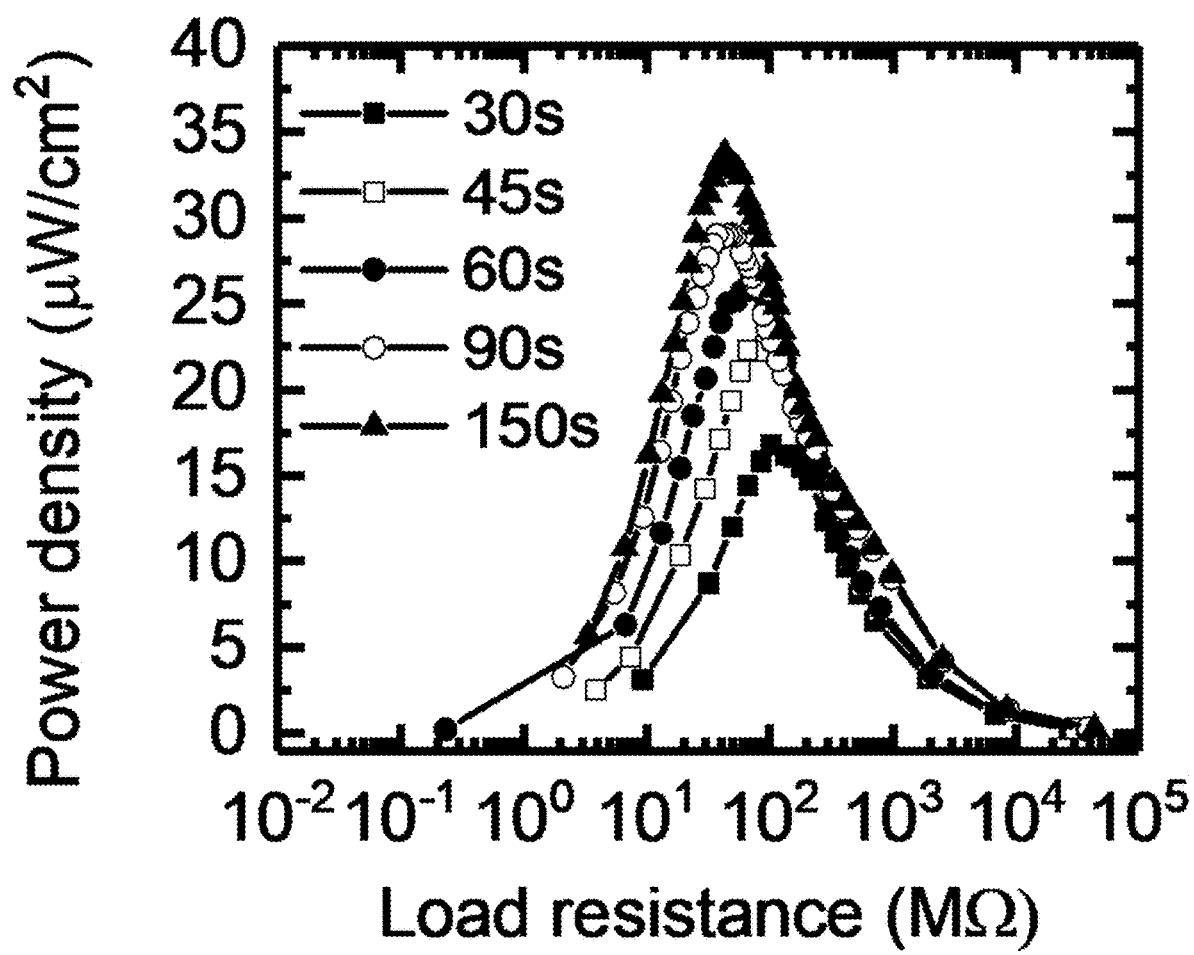
FIG. 12B shows the power density curves for the solid oxide battery from FIG. 12A for various charging times.

FIG. 12A shows the peak power density as a function of the charging time in the case where the exemplary solid oxide battery is charged under wet $N_2$. FIG. 12B shows the power density curves corresponding to charging times of 30, 45, 60, 90, and 150 seconds. These results indicate that the solid oxide battery can be charged substantially faster in an environment containing appreciable amounts of water, such as in the wet $N_2$ case where humidity is 100%. Compared to the charging times in FIG. 7, which was measured under ambient environment at humidity of 60%, the charging times in FIG. 12A are approximately ten times shorter while the peak power density is approximately 80% of the peak power shown in FIG. 5. This indicates the water concentration in the ambient environment can be tailored to decrease the charging time and increase the power density of the solid oxide battery.

In some embodiments, an additional layer can be disposed onto the second electrode to provide a stable source of water to be used by the solid oxide battery. For example, the layer can be a sol gel layer containing water. The solid oxide battery can thus be charged by splitting water contained in the water-containing layer. During discharge, the formation of water can be received and stored by the water-containing layer. In this manner, the performance of the solid oxide battery during charging and discharging can be repeatable and reliable, particularly in cases where the water concentration in the ambient environment may be variable or the second electrode has limited exposure to the ambient environment. For example, the solid oxide battery can be integrated with an electronic device where additional material layers may be disposed onto the second electrode, thus necessitating a water-containing layer to supply water to the solid oxide battery.

Increasing the Energy Density

As described above, the energy density of exemplary solid oxide batteries may be comparable to conventional thin film lithium-ion batteries. One approach to improve the energy density can be to increase the thickness of the solid electrolyte and thus provide more material to store hydrogen. However, this approach can be limited since increasing the thickness of the solid electrolyte can cause a corresponding reduction in the power density of the solid oxide battery for sufficiently thick solid electrolyte layers.

Figure 13:
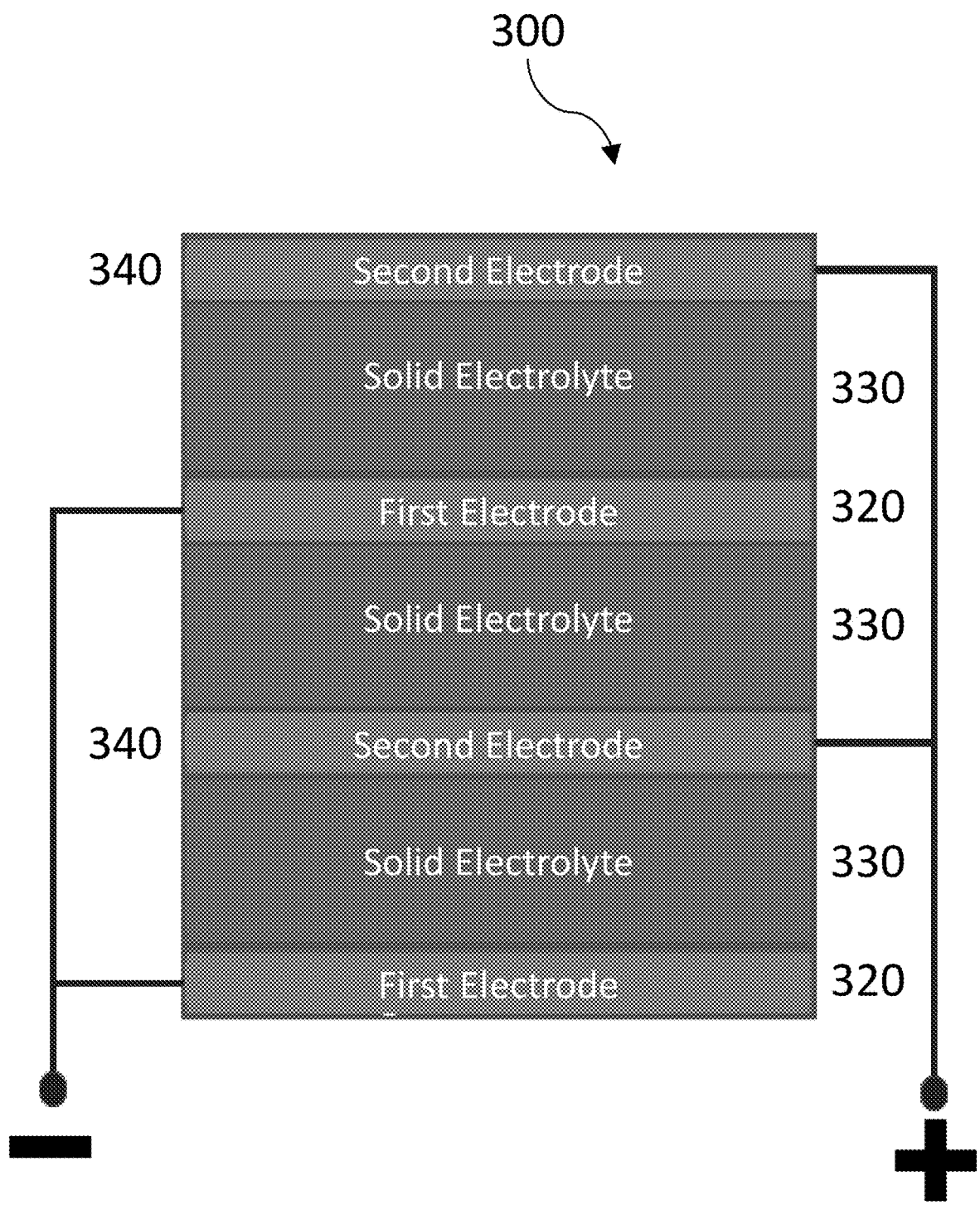
FIG. 13 is a schematic illustration of a plurality of solid oxide batteries in a stacked configuration.

Another approach to improve the energy density can be to create a solid oxide battery 300 with multiple layers of solid electrolyte 330 and electrodes disposed between each layer of solid electrolyte 330. For example, FIG. 13 shows an exemplary embodiment of a multilayer structure with multiple layers of solid electrolyte 330. The first electrode 320 and the second electrode 340 can alternate between each layer of solid electrolyte 330. By using multiple layers of solid electrolyte 330 that can share electrodes in this manner, the energy density can be increased while the power density can be maintained. The electrolyte layers 330 can made of different materials, e.g., they may alternate between layers of $GdO_x$ and $YO_x$. Similarly, the first and second electrodes can be made of different metals, e.g., they may alternate between layers of Au and Pt.

The second electrodes 340 disposed within the multilayer structure can be configured to receive water from the ambient environment from the sides of the structure. For example, the multilayer structure can have a narrow aspect ratio, e.g., a wire with multiple segments corresponding to each layer of the solid oxide battery 300. The second electrode 340 can also include a water-containing layer, as described above, which provides a source of water to facilitate operation of the solid oxide battery 300. For example, the second electrode 340 within the multilayer structure can be split into two separate layers with the water-containing layer disposed between the two layers comprising the second electrode 340.

Flexible Batteries

Figure 14B:
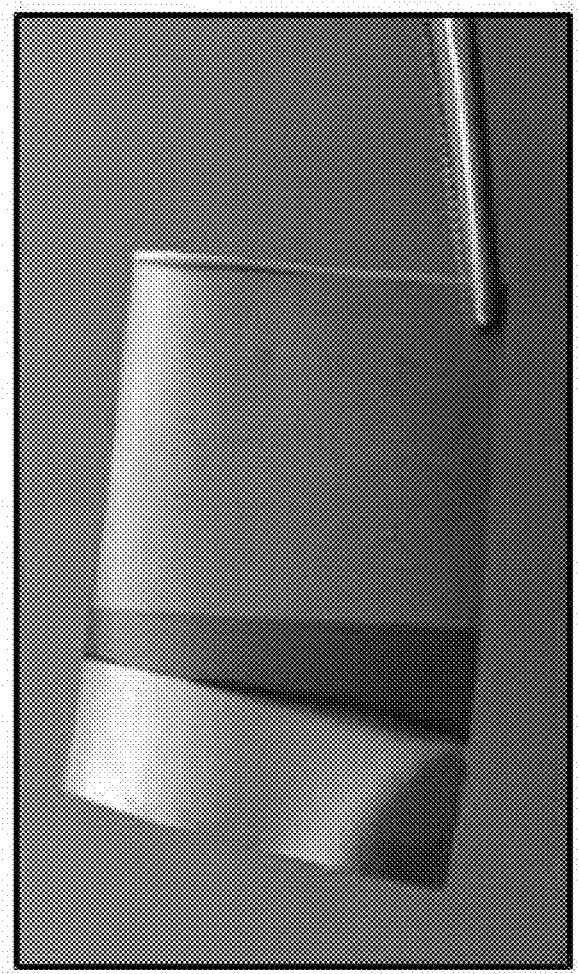
FIG. 14B shows a flexible solid oxide battery manufactured using a polyether ether ketone (PEEK) substrate.
Figure 14A:
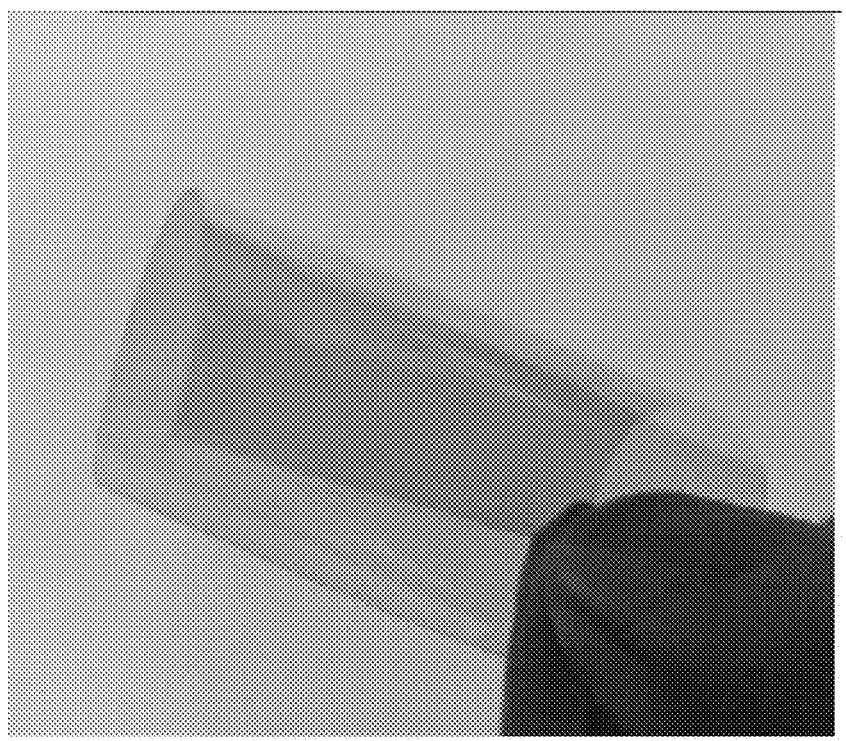
FIG. 14A shows a flexible solid oxide battery manufactured using a polyimide substrate.
Figure 15:
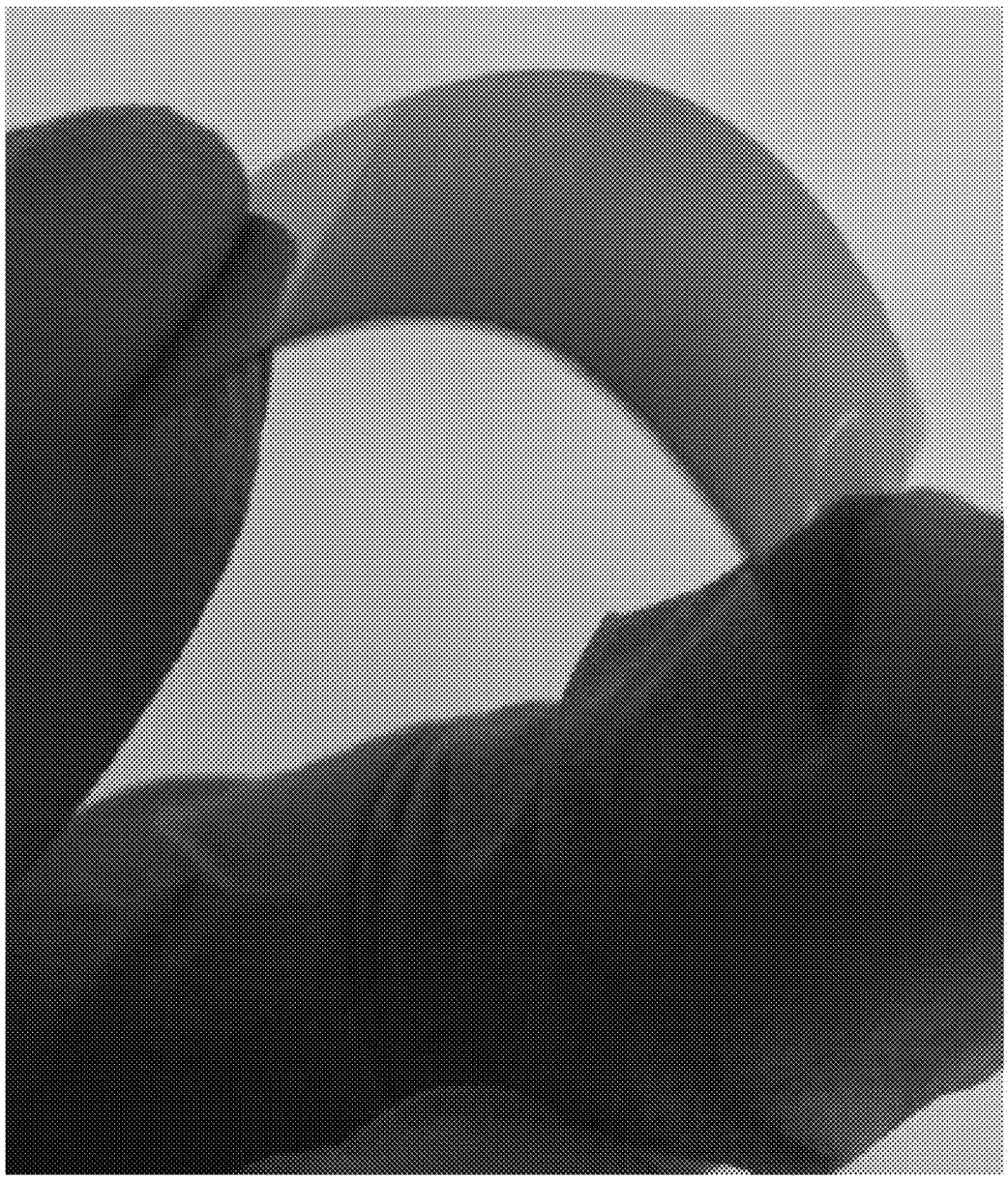
FIG. 15 shows a top-down view of a flexible solid oxide battery manufactured using a PEEK substrate.

In some embodiments, a solid oxide battery can be manufactured using a flexible substrate. The thin form factor of the solid oxide battery can allow the constituent layers of the device to bend without compromising the integrity of the device or substantially altering the material properties. FIGS. 14A and 14B show an exemplary 200 μm diameter solid oxide battery formed using a polyimide substrate. FIG. 15 shows an exemplary 200 μm diameter solid oxide battery formed using a polyether ether ketone (PEEK) substrate. The flexible solid oxide batteries were fabricated using a similar process, as described above, where a 50 nm thick layer of $SiO_2$ was first deposited onto the respective substrates using RF sputtering at a power of 200 W. This followed by the deposition of the first electrode (4 nm of Ta and 10 nm of Pt), the solid electrolyte (20 nm, 80 nm of $GdO_x$), and the second electrode (3 nm of Au). A solid oxide battery was deposited onto a silicon substrate for reference. The solid electrolyte was 20 nm thick for the silicon and polyimide devices and 80 nm thick for the PEEK device.

Figure 16:
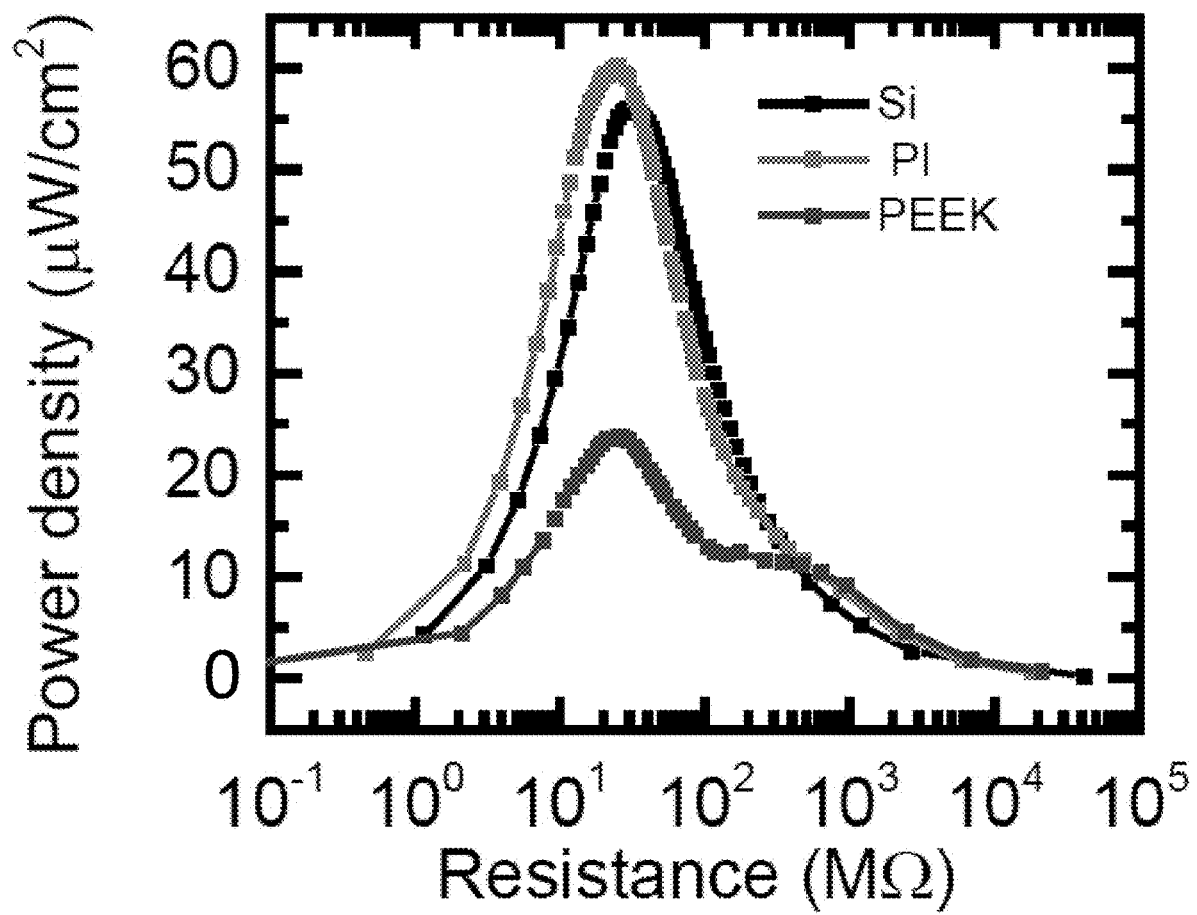
FIG. 16 shows power density curves of solid oxide batteries manufactured using various substrates.

The performance of the exemplary flexible solid oxide batteries was also characterized. FIG. 16 shows the power density curves for three exemplary solid oxide batteries fabricated using polyimide, PEEK, and Si substrates. In particular, the solid oxide battery formed on polyimide reached a peak power density of 60 $\mu W/cm^2$, which is comparable to the solid oxide battery formed on Si. Thus, the architecture described herein for the solid oxide battery can also be used in flexible electronic devices, such as wearable electronic devices that conform in shape to the human body.

Integrated Circuits (ICs) with Solid Oxide Batteries

The small form factor and CMOS compatibility of the solid oxide battery can enable easier integration with electronic devices. In some applications, the solid oxide battery can be used in a distributed power system where an electronics device is integrated with several solid oxide batteries configured to power various subsystems within the electronics device. The use of a distributed power system can increase the device's energy efficiency, reduce the overall size of the device by reducing the amount of material used in the metal traces to distribute power, and improve the reliability of the electronic device since each solid oxide battery functions as a stand-alone unit.

Figure 17:
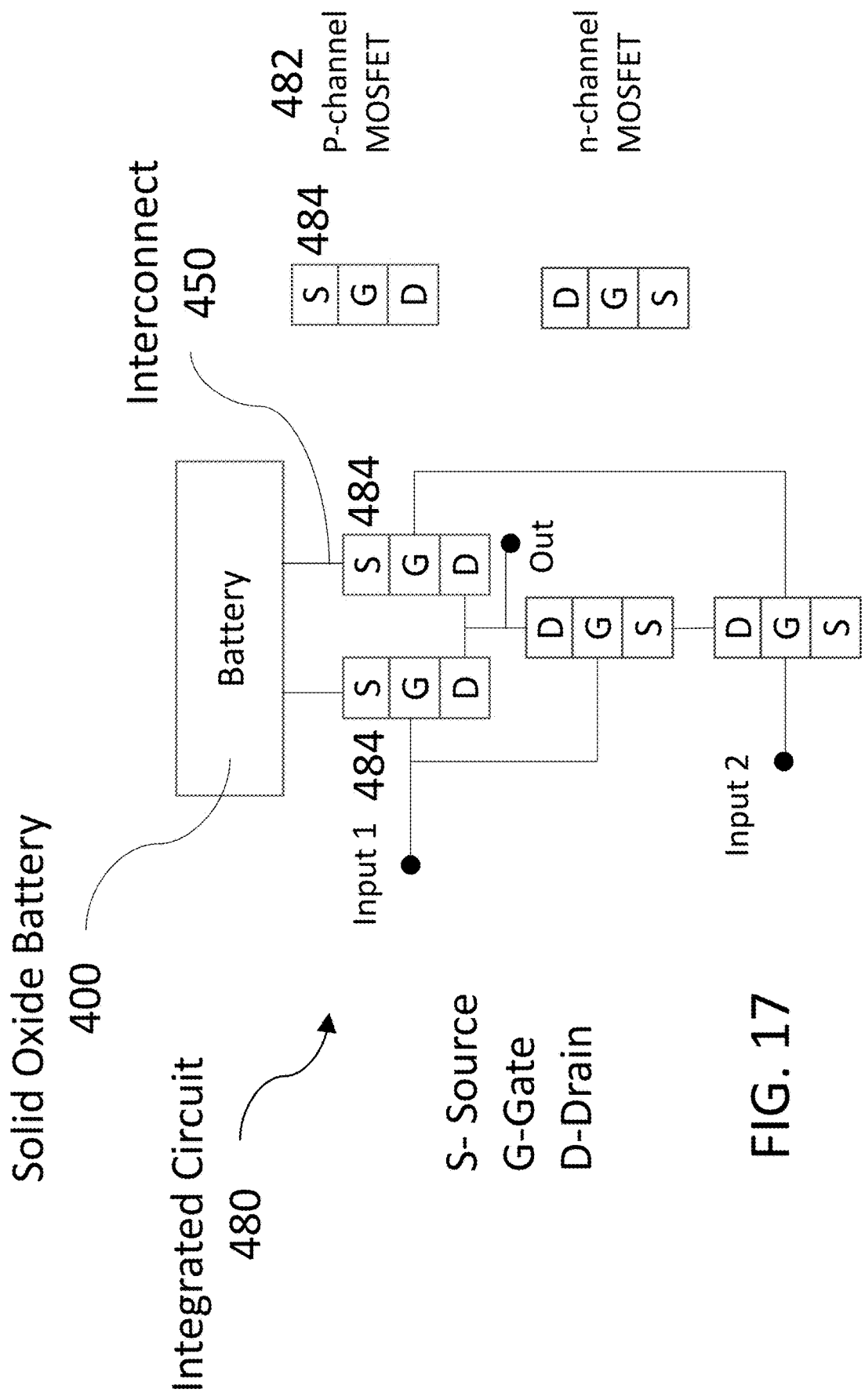
FIG. 17 is a top-down view of a solid oxide battery incorporated into a separate region of an integrated circuit (IC).

For example, a plurality of solid oxide batteries can be incorporated into an IC such that each transistor or a small group of transistors is powered by a single solid oxide battery. FIG. 17 shows one exemplary implementation of a solid oxide battery 400 disposed in a separate region proximate to an integrated circuit 480. Interconnects 450 electrically couple the solid oxide battery 400 to the source terminals 484 of the p-channel transistors 482 in a parallel configuration to the IC 480. By disposing the solid oxide battery 400 in close proximity to the IC 480 in this manner, the voltage and current inputs needed to operate the IC 480 can be reduced, which can simplify the various layers of metal traces conventionally used in IC's to distribute electrical power to each transistor.

Figure 18A:
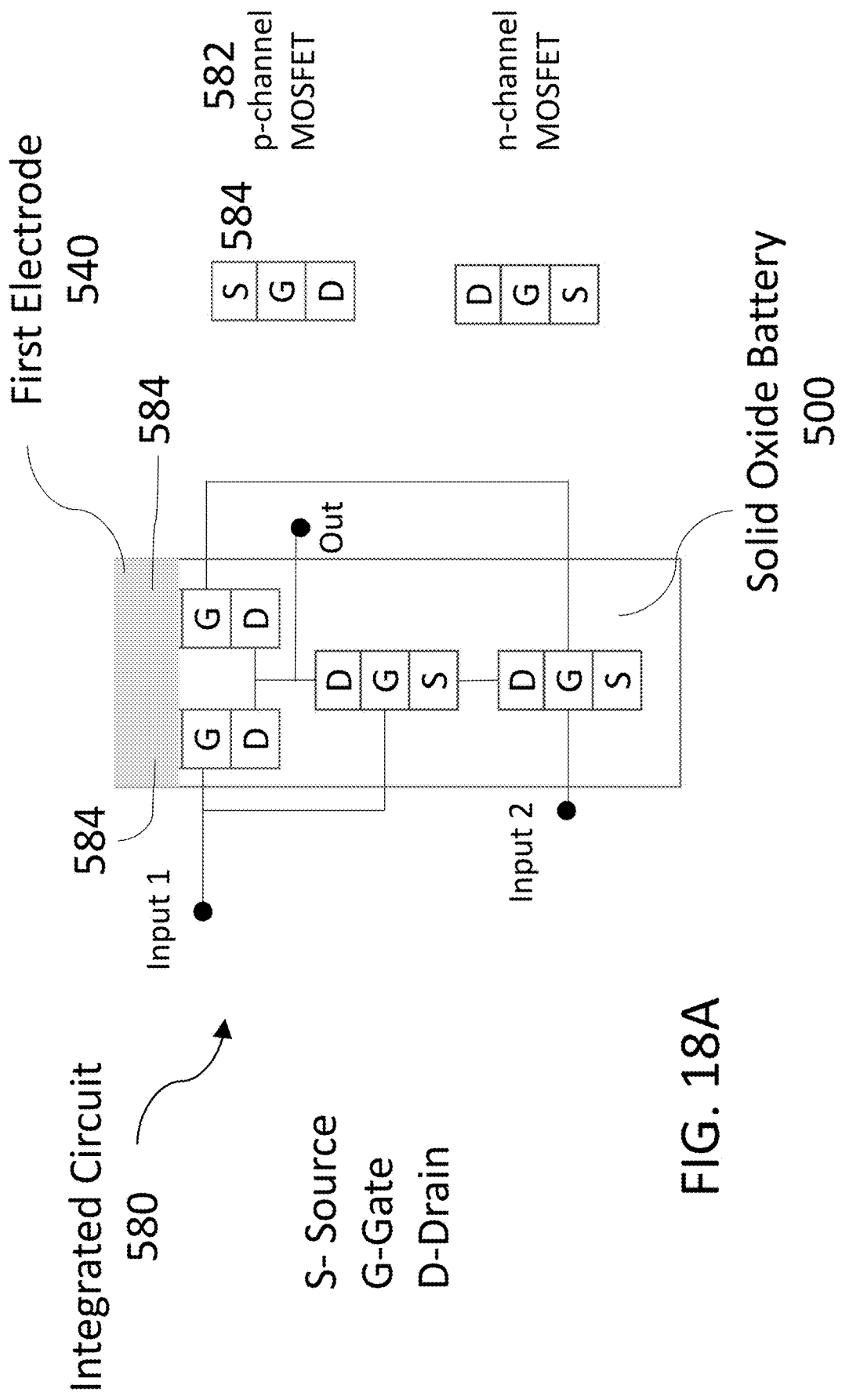
FIG. 18A is a top-down view of a solid oxide battery incorporated as an overlayer in an IC.
Figure 18B:
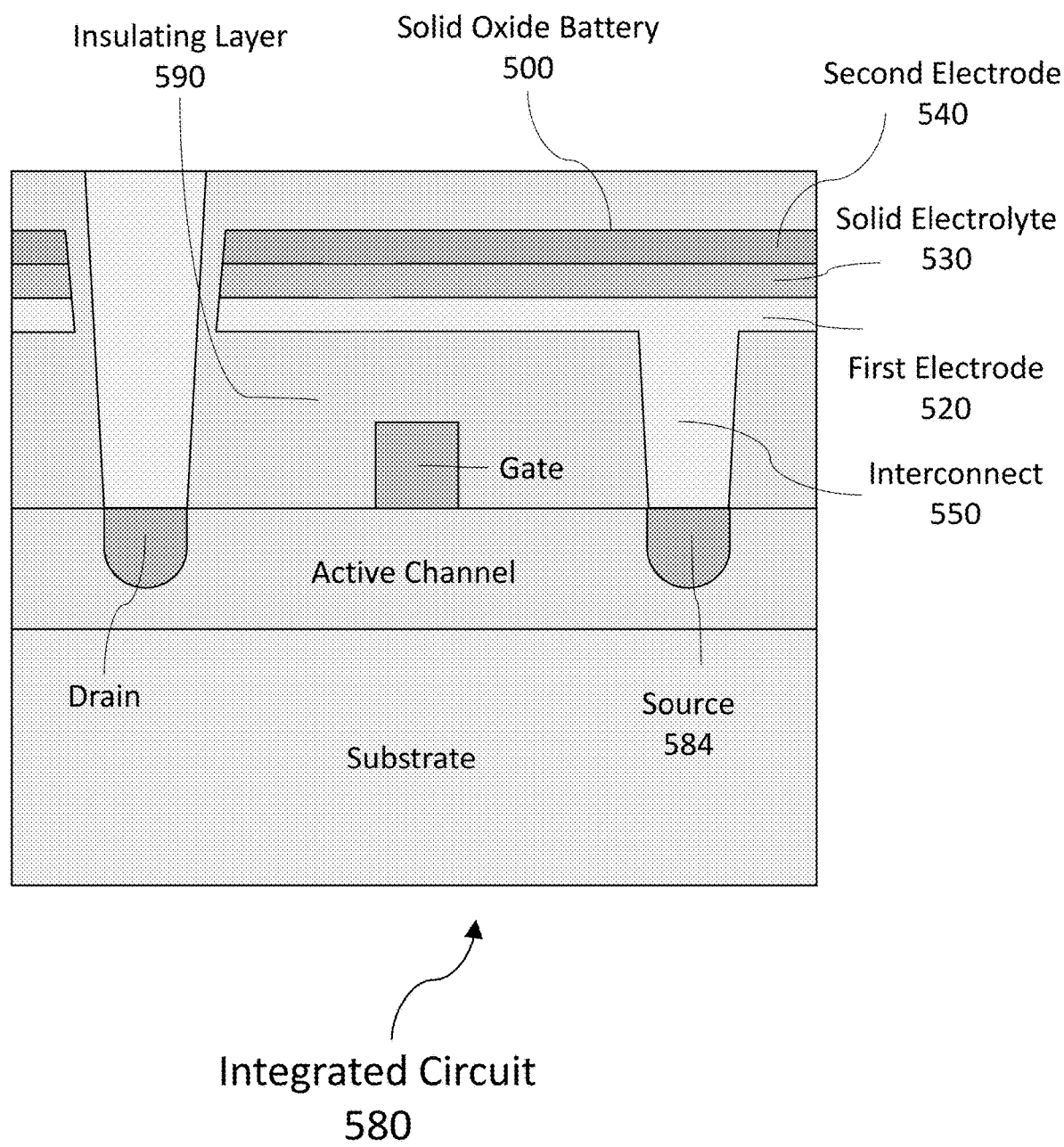
FIG. 18B is a cross-sectional view of the exemplary IC from FIG. 18A along a plane coinciding with the active channel of a transistor.

FIG. 18A shows another exemplary implementation of a solid oxide battery 500 as a layer deposited on an integrated circuit 580. For example, once the transistors and the first few metal layers are fabricated, an electrically insulating layer 590 can be deposited followed by deposition of the solid oxide battery 500. FIG. 18B shows a cross sectional view of the exemplary solid oxide battery 500, which includes a first electrode 520, a solid electrolyte 530, and a second electrode 540. An interconnect 550 can couple the first electrode 520 of the solid oxide battery 500 to the source terminal 584 on the p-channel transistor 582, as shown in FIG. 18B. In this manner, a solid oxide battery can be integrated into an IC as an intermediate layer separating the device layer of the IC, where the transistors are located, and the plurality of metal layers containing the traces.

A similar architecture for a distributed power system can also be of use in other devices including, but not limited to, electrically powered sensors, microelectromechanical systems (MEMS) devices, and biomedical devices for drug delivery. The simple architecture of the solid oxide battery can also lead to scaled up solid oxide batteries with a larger energy capacity for integration into larger devices while maintaining a large energy to mass/volume ratio. For example, a scaled up solid oxide battery can be based on the multilayer structure described above. The solid oxide battery can be used as an integrated fuel cell to power various systems on a vehicle, e.g., propulsion systems, lighting systems, and sensing systems. The solid oxide battery can also be disposed as a coating on various internal electronic components or on an exterior housing of an electronic device, e.g., a portable device such as a smart phone or tablet, to increase the battery capacity.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A battery comprising:
    a first electrode;
    a second electrode comprising a noble metal and a surface in direct contact with a water source; and
    a solid electrolyte, disposed between the first electrode and the second electrode and defining an interface in direct contact with the second electrode, to store protons generated by splitting water from the water source at the interface.

2. The battery of claim 1, wherein the second electrode has a thickness of about 3 nm to about 10 nm.

3. The battery of claim 1, wherein the first electrode is deposited on a flexible substrate.

4. The battery of claim 1, wherein the solid electrolyte has a thickness of about 4 nm to about 100 nm.

5. The battery of claim 1, wherein the solid electrolyte comprises a solid oxide having a bixbyite structure.

6. The battery of claim 1, wherein the solid electrolyte comprises at least one of gadolinium oxide or yttrium oxide.

7. The battery of claim 1, wherein the solid electrolyte comprises an anode region bordering the second electrode, a cathode region bordering the first electrode, and an electrolyte region disposed between the anode region and the cathode region.

8. The battery of claim 1, wherein the solid electrolyte is a first solid electrolyte and the interface is a first interface, and further comprising:
    a third electrode; and
    a second solid electrolyte disposed between the second electrode and the third electrode and defining a second interface with the third electrode, to store protons generated by splitting water at the second interface.

9. The battery of claim 8, wherein the first solid electrolyte comprises a different material than the second solid electrolyte and the second electrode comprises a different material than the third electrode.

10. The battery of claim 1, wherein the second electrode is patterned with a plurality of openings to allow water molecules to pass through.

11. The battery of claim 1, wherein the second electrode has a thickness is a range of 3 nm to 10 nm.

12. The battery of claim 1, wherein the water source comprises ambient atmosphere.

13. The battery of claim 1, wherein the water source comprises liquid water.

14. The battery of claim 1, wherein the water source comprises a sol gel layer disposed onto the surface of the second electrode.

\* \* \* \* \*